US011296613B2

(12) United States Patent
Nishizawa et al.

(10) Patent No.: US 11,296,613 B2
(45) Date of Patent: Apr. 5, 2022

(54) POWER CONVERSION DEVICE

(71) Applicant: HITACHI AUTOMOTIVE SYSTEMS, LTD., Hitachinaka (JP)

(72) Inventors: Youhei Nishizawa, Hitachinaka (JP); Fusanori Nishikimi, Hitachinaka (JP); Yusaku Katsube, Hitachinaka (JP)

(73) Assignee: HITACHI AUTOMOTIVE SYSTEMS, LTD., Ibaraki (JP)

(*) Notice: Subject to any disclaimer, the term of this patent is extended or adjusted under 35 U.S.C. 154(b) by 193 days.

(21) Appl. No.: 16/648,066

(22) PCT Filed: Jul. 17, 2018

(86) PCT No.: PCT/JP2018/026645
§ 371 (c)(1),
(2) Date: Mar. 17, 2020

(87) PCT Pub. No.: WO2019/064833
PCT Pub. Date: Apr. 4, 2019

(65) Prior Publication Data
US 2020/0266724 A1    Aug. 20, 2020

(30) Foreign Application Priority Data

Sep. 29, 2017   (JP) .............................. JP2017-191940

(51) Int. Cl.
*H02M 7/00*        (2006.01)
*H02M 7/5387*     (2007.01)
(Continued)

(52) U.S. Cl.
CPC ....... *H02M 7/003* (2013.01); *H02M 7/53871* (2013.01); *H02P 27/06* (2013.01); *H05K 5/0247* (2013.01); *H05K 5/065* (2013.01)

(58) Field of Classification Search
CPC .............................. H02M 7/003; H02P 27/06
See application file for complete search history.

(56) References Cited

U.S. PATENT DOCUMENTS 6,954,368 B1 * 10/2005 Francoeur ............. H02M 7/003
                                                                361/763
2015/0029666 A1 * 1/2015 Kosuga ................... B60L 50/51
                                                                361/699
2016/0241136 A1   8/2016 Nakashima et al.

FOREIGN PATENT DOCUMENTS

JP   2005-093658 A   4/2005
JP   2012-105541 A   5/2012
(Continued)

OTHER PUBLICATIONS

International Search Report, PCT/JP2018/026645, dated Aug. 28, 2018, 2 pgs.

*Primary Examiner* — Mukundbhai G Patel
(74) *Attorney, Agent, or Firm* — Volpe Koenig

(57) ABSTRACT

The inductance of a noise filter circuit is reduced, and an output is increased, whereby positive and negative electrode power supply side conductors each include a first and second conductor portions having a side surface and a main surface having an area larger than an area of the side surface. The first conductor portions are arranged on one surface of a base portion with an insulating member interposed therebetween. The second conductor portions penetrate through a core member in a state in which the main surfaces face each other. A width of a portion of the first conductor portion which is in contact with the insulating member in a direction perpendicular to current flow direction is larger than a width of a portion of the second conductor portion which is disposed within the core member in the direction perpendicular to current flow direction.

10 Claims, 16 Drawing Sheets

(51) Int. Cl.
*H02P 27/06* (2006.01)
*H05K 5/02* (2006.01)
*H05K 5/06* (2006.01)

(56) References Cited

FOREIGN PATENT DOCUMENTS

| | | |
|---|---|---|
| JP | 2014-161154 A | 9/2014 |
| JP | 2014-222974 A | 11/2014 |
| WO | 2015/056286 A1 | 4/2015 |

\* cited by examiner (a)

(b)

POWER CONVERSION DEVICE

TECHNICAL FIELD

The present invention relates to a power conversion device.

BACKGROUND ART

In recent years, hybrid vehicles, plug-in hybrid vehicles, and electric vehicles have been popularized in order to comply with fuel consumption environments and exhaust gas regulations. There is a problem regarding suppression of electromagnetic compatibility (EMC) noise generated from a power conversion device used in such a vehicle.

The power conversion device includes a power conversion main circuit such as an inverter including a power module and a capacitor module for smoothing a DC power, and a noise filter circuit. A power conversion device in which an output is increased by achieving a low inductance of a structure of a connection portion between the capacitor module and the power module and low inductances of structures of a capacitor element and a support frame in the capacitor module has been known (see, for example, PTL 1).

CITATION LIST

Patent Literature

PTL 1: JP 2012-105541 A

SUMMARY OF INVENTION

Technical Problem

PTL 1 does not describe any structure for reducing the inductance of the noise filter circuit unit.

Solution to Problem

According to an aspect of the present invention, a power conversion device includes a DC power supply terminal to which a DC power is supplied, a capacitor circuit unit that smooths the DC power, and supplies the smoothed DC power to a power conversion circuit unit, a power supply side conductor that connects the DC power supply terminal and the capacitor circuit unit to each other, a core member that surrounds a part of the power supply side conductor, and a base that houses the power supply side conductor and the core member. The power supply side conductor includes a positive electrode side conductor and a negative electrode side conductor, each of the positive electrode side conductor and the negative electrode side conductor includes a first conductor and a second conductor which each have a side surface and a main surface having an area larger than an area of the side surface, the first conductor portions of the positive electrode side conductor and the negative electrode side conductor are arranged on one surface of the base with an insulating member interposed therebetween, the second conductors of the positive electrode side conductor and the negative electrode side conductor penetrate the core member in a state in which the main surfaces face each other, and widths of portions of the first conductor portions of the positive electrode side conductor and the negative electrode side conductor which are in contact with the insulating member in a direction perpendicular to a direction in which a current flows are larger than widths of portions of the second conductor portions of the positive electrode side conductor and the negative electrode side conductor which are arranged within the core member in the direction perpendicular to the direction in which the current flows.

Advantageous Effects of Invention

According to the present invention, it is possible to reduce inductance of a noise filter circuit, and it is possible to increase an output.

DESCRIPTION OF EMBODIMENTS

Hereinafter, an embodiment of a power conversion device of the present invention will be described with reference to the drawings.

A high-voltage battery for driving a power, an inverter device, a DC-DC converter device, and a low-voltage battery as an auxiliary power supply for a low-voltage load are mounted on vehicles such as a hybrid vehicle (HEV), a plug-in hybrid vehicle, and an electric vehicle (EV). The inverter device and the DC-DC converter device are connected to the high-voltage battery. The inverter device converts a DC high-voltage output of the high-voltage battery into an AC high-voltage output, and drives a motor. The DC-DC converter device includes conversion means for converting a DC voltage of a high voltage from the high-voltage battery into an AC high voltage, conversion means for converting an AC high voltage into an AC low voltage, conversion means for converting an AC low voltage into a DC low voltage, and an output terminal that outputs the converted voltage. The output terminal of the DC-DC converter device is connected to the low-voltage battery and a low-voltage load to supply a power to the low-voltage load such as a vehicle light, a radio, or an ECU or charge the low-voltage battery.

The inverter device and the DC-DC converter device may be integrated and assembled.

Figure 1:
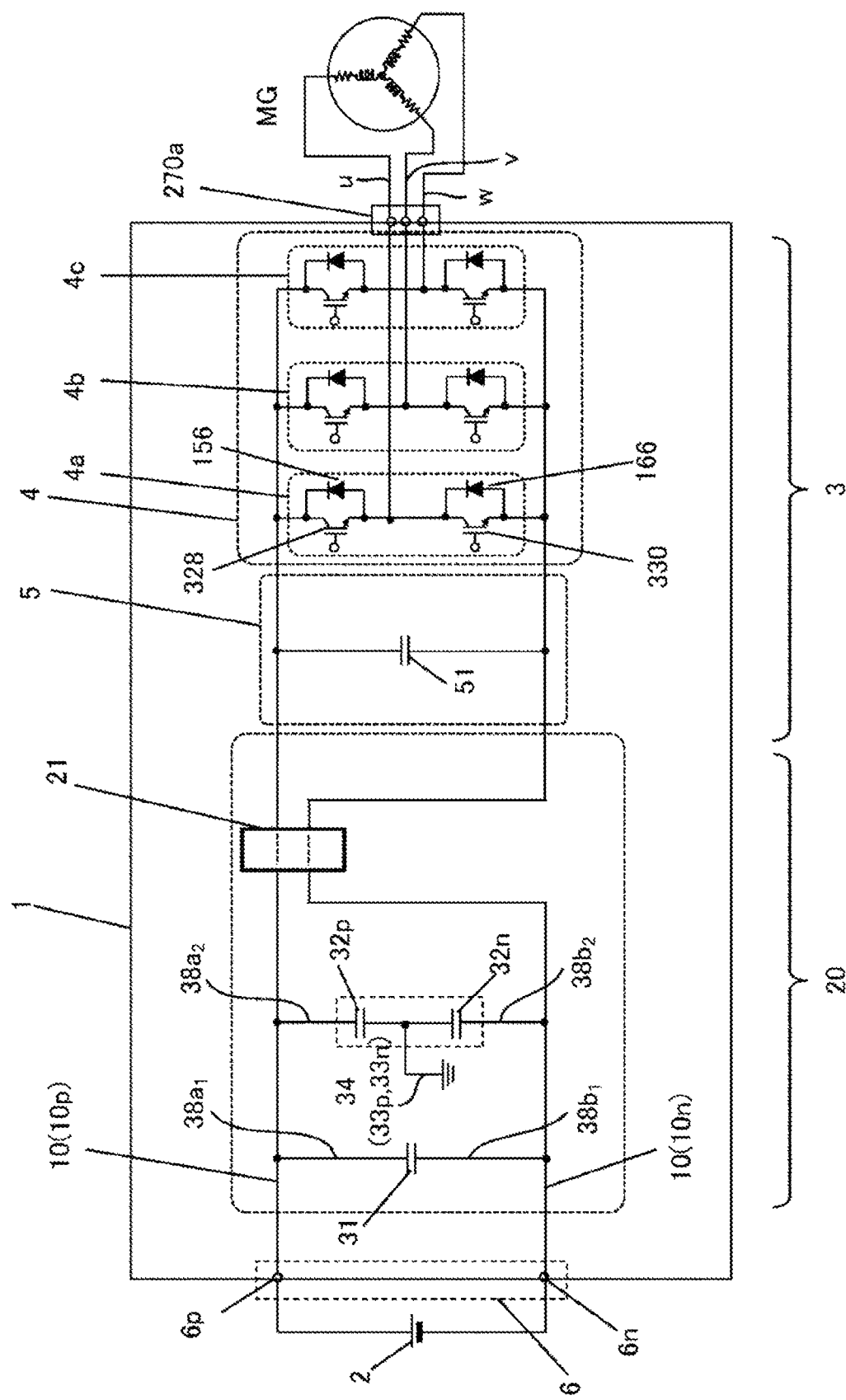
FIG. 1 is a circuit diagram illustrating an inverter main circuit and a noise filter circuit of a power conversion device.

FIG. 1 is a circuit diagram illustrating an inverter main circuit and a noise filter circuit of a power conversion device 1.

The power conversion device 1 includes an inverter main circuit 3 that converts a DC power into an AC power, and a noise filter circuit unit 20 that suppresses electromagnetic noise generated by the inverter main circuit 3 during a power conversion operation. Hereinafter, a device having a configuration surrounded by a rectangular frame including the inverter main circuit 3 and the noise filter circuit unit 20 illustrated in FIG. 1 will be described as the power conversion device 1. The inverter main circuit 3 is connected to an AC terminal 270a. A motor generator MG outputs a driving force of the HEV or EV based on the AC power supplied from the inverter main circuit 3 via the AC terminal 270a. The motor generator MG also acts as a generator that regenerates an AC power to a high-voltage battery 2 when a motor is rotated by an external force. The high-voltage battery 2 is a DC power supply of the HEV or EV.

The inverter main circuit 3 includes a power conversion circuit 4 that converts a DC power into an AC power, and a capacitor circuit unit 5 that smooths the DC power.

The power conversion circuit 4 includes three power semiconductor modules 4a, 4b, and 4c. Each of the power semiconductor modules 4a, 4b, and 4c includes a switching element 328 and a diode 156 of an insulated-gate bipolar transistor (IGBT) which is operated as an upper arm, and a switching element 330 and a diode 166 of an IGBT which is operated as a lower arm. The switching element 328 of the upper arm and the switching element 330 of the lower arm convert the DC power into the AC power. The diodes 156 and 166 also have a function of converting the AC power into the DC power during regeneration.

The power semiconductor module 4a is connected to a u phase of the motor generator MG via the AC terminal 270a. The power semiconductor module 4b is connected to a v phase of the motor generator MG via the AC terminal 270a. The power semiconductor module 4c is connected to a w phase of the motor generator MG through the AC terminal 270a.

The capacitor circuit unit 5 includes a capacitor element 51. The capacitor circuit is connected between the high-voltage battery 2 and the power conversion circuit 4 to smooth the DC power, and supplies the smoothed DC power to the power conversion circuit 4.

The noise filter circuit unit 20 is provided between a DC power supply terminal 6 and the capacitor circuit unit 5, and suppresses electromagnetic noise generated when the power conversion circuit 4 performs the power conversion operation.

The noise filter circuit unit 20 includes a power supply side conductor 10, an X capacitor 31, positive and negative electrode side Y capacitors 32p and 32n, and a core member 21. The power supply side conductor 10 is a power transmission path that connects the high-voltage battery 2 and the capacitor circuit unit 5 to each other. The power supply side conductor 10 has a positive electrode power supply side conductor 10p and a negative electrode power supply side conductor 10n. The positive and negative electrode power supply side conductors 10p and 10n are connected to the positive and negative electrode side terminals of the high-voltage battery 2 via the DC power supply terminal 6.

The X capacitor 31 is connected between the positive electrode power supply side conductor 10p and the negative electrode power supply side conductor 10n, and smooths a power having a frequency higher than a frequency of a power smoothed by the capacitor circuit unit 5. The positive and negative electrode side Y capacitors 32p and 32n are connected between the positive electrode power supply side conductor 10p and a ground terminal 34 and between the negative electrode power supply side conductor 10n and the ground terminal 34, and smooth the power.

The core member 21 suppresses electromagnetic noise by absorbing fluctuations in a current flowing through the power supply side conductor 10.

Figure 2:
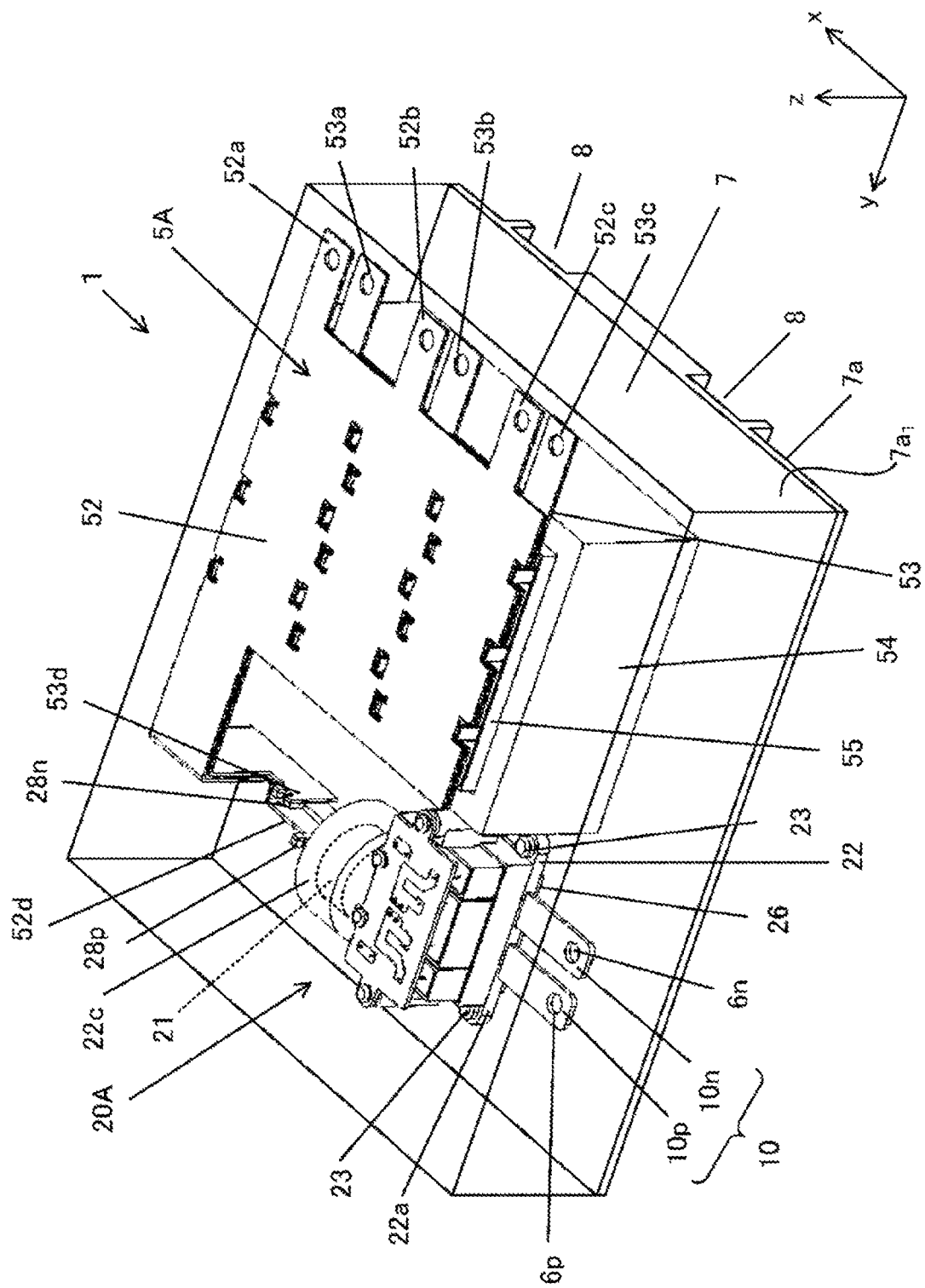
FIG. 2 is an external perspective view of the power conversion device.
Figure 3:
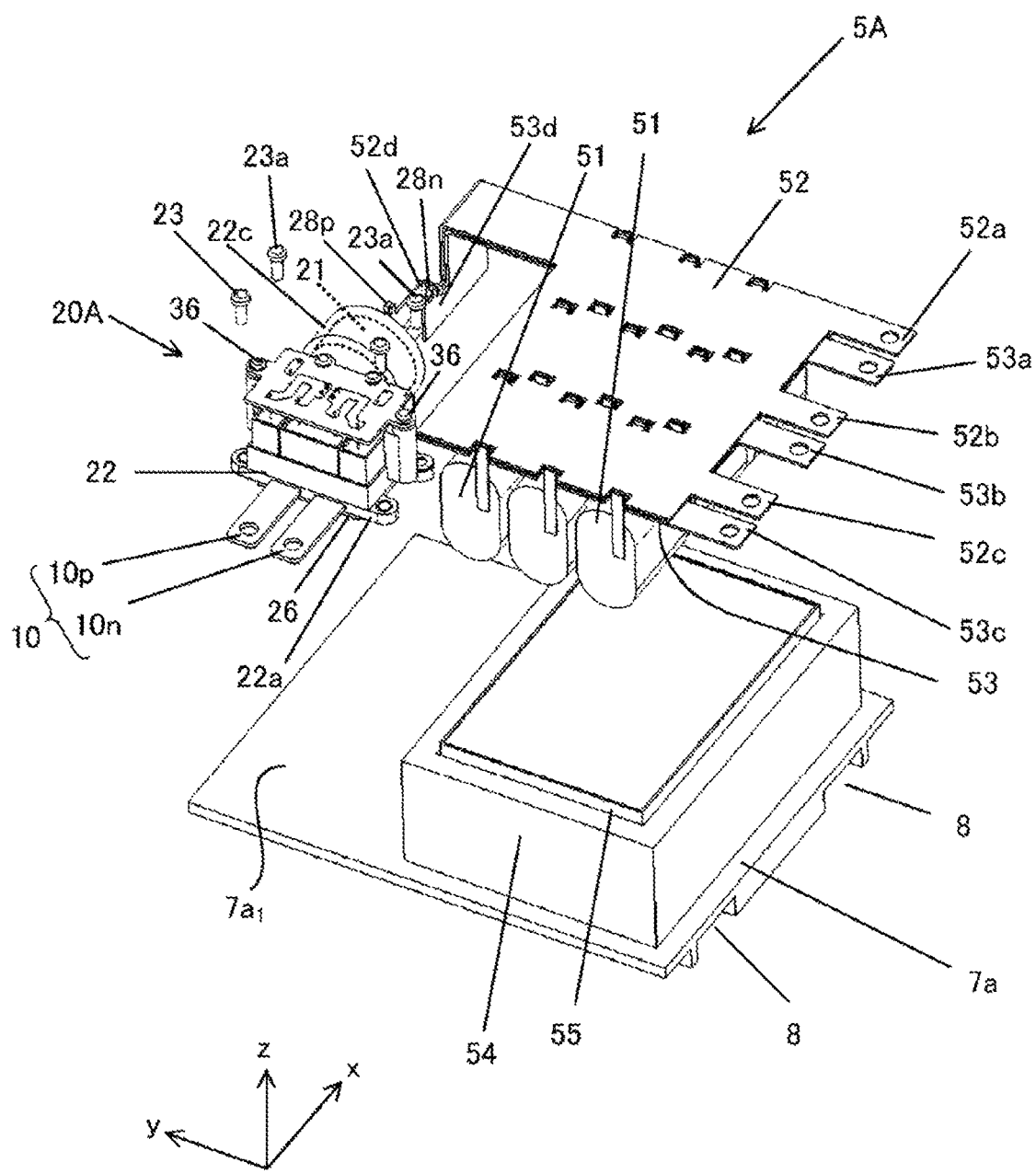
FIG. 3 is an exploded perspective view of the power conversion device illustrated in FIG. 2.

FIG. 2 is an external perspective view of the power conversion device 1, and FIG. 3 is an exploded perspective view of the power conversion device 1 illustrated in FIG. 2.

The power conversion device 1 includes a case 7, a noise filter assembly 20A housed in the case 7, and a capacitor module 5A. FIG. 2 illustrates an inside of the case 7 through a peripheral side portion and an upper portion of the case 7. In FIG. 3, only a bottom portion 7a of the case 7 is illustrated, and the peripheral side portion and the upper portion of the case 7 are not illustrated.

The case 7 is made of a metal or a resin having high thermal conductivity. A cooling path 8 through which a coolant such as cooling water circulates is formed at the bottom portion 7a of the case 7. A box-shaped capacitor housing portion 54 having an opened upper side is disposed in the case 7. In the following description of FIG. 2, an x direction, a y direction, and a z direction are as illustrated.

Although a specific structure of the noise filter assembly 20A will be described below, the noise filter assembly 20A includes components of the noise filter circuit unit 20 illustrated in the circuit diagram of FIG. 1. The noise filter assembly 20A includes a resin member 22. The resin member 22 is fixed to the bottom portion 7a of the case 7 via a flexible insulating sheet 26 made of, for example, a silicon-based material. An upper surface 7a1 of the bottom portion 7a of the case is parallel to an xy plane. A through hole 24 (see FIG. 6) is formed in the resin member 22, and a screw 23 (see FIG. 4) is inserted into the through hole 24. The resin member 22 is fixed to the upper surface 7a1 of the bottom portion 7a of the case 7. The insulating sheet 26 has flexibility so as to be deformed in accordance with irregularities on surfaces of the upper surface 7a1 of the bottom portion 7a of the case 7 and a lower surface of the resin member 22. Accordingly, the upper surface 7a1 of the bottom portion 7a of the case 7 and the lower surface of the member 22 are brought into close contact with each other, and thus, thermal conductivity can be improved.

The capacitor module 5A corresponds to the capacitor circuit unit 5 in FIG. 1, and includes metal circuit conductor portions 52 and 53, and a plurality of capacitor elements 51. Positive and negative electrode terminals of each capacitor element 51 are connected to the circuit conductor portions 52 and 53 via conductive leads. Connection portions 52a and 53a of the circuit conductor portions 52 and 53 are connected to the power semiconductor module 4a. Connection portions 52b and 53b of the circuit conductor portions 52 and 53 are connected to the power semiconductor module 4b.

Connection portions 52c and 53c of the circuit conductor portions 52 and 53 are connected to the power semiconductor module 4c. At the circuit conductor portions 52 and 53, positive and negative electrode conductor connection portions 52d and 53d are formed on sides facing the connection portions 52a to 52c and 53a to 53c.

An insulating case 55 is housed in the capacitor housing portion 54 disposed in the case 7. The insulating case 55 is formed in a bag shape having an opened upper portion so as to be in contact with an inner surface of a sidewall of the capacitor housing portion 54. The insulating case 55 is formed of a resin such as poly phenylene sulfide resin (PPS), for example. All the capacitor elements 51 of the capacitor module 5A are housed in the insulating case 55.

The noise filter assembly 20A includes the power supply side conductor 10 as described above. The power supply side conductor 10 includes the positive electrode power supply side conductor 10p and the negative electrode power supply side conductor 10n. Positive and negative electrode DC connection portions 6p and 6n (see FIG. 2) connected to the DC power supply terminal 6 are formed at one ends of the positive and negative electrode power supply side conductors 10p and 10n. In the illustrated example, the positive and negative electrode DC connection portions 6p and 6n are illustrated as through holes through which fastening members such as screws are inserted. However, various structures such as a convex portion or a bifurcated projecting piece that sandwiches the terminal can be adopted as the positive and negative electrode DC connection portions 6p and 6n. Positive and negative electrode capacitor connection portions 28p and 28n are formed on sides of the positive and negative electrode power supply side conductors 10p and 10n opposite to the positive and negative electrode DC connection portions 6p and 6n, that is, on the positive and negative electrode conductor connection portions 52d and 53d sides of the capacitor module 5A. The positive and negative electrode capacitor connection portions 28p and 28n of the positive and negative electrode power supply side conductors 10p and 10n are electrically connected to the positive and negative electrode conductor connection portions 52d and 53d of the capacitor module 5A by welding, for example.

Figure 4:
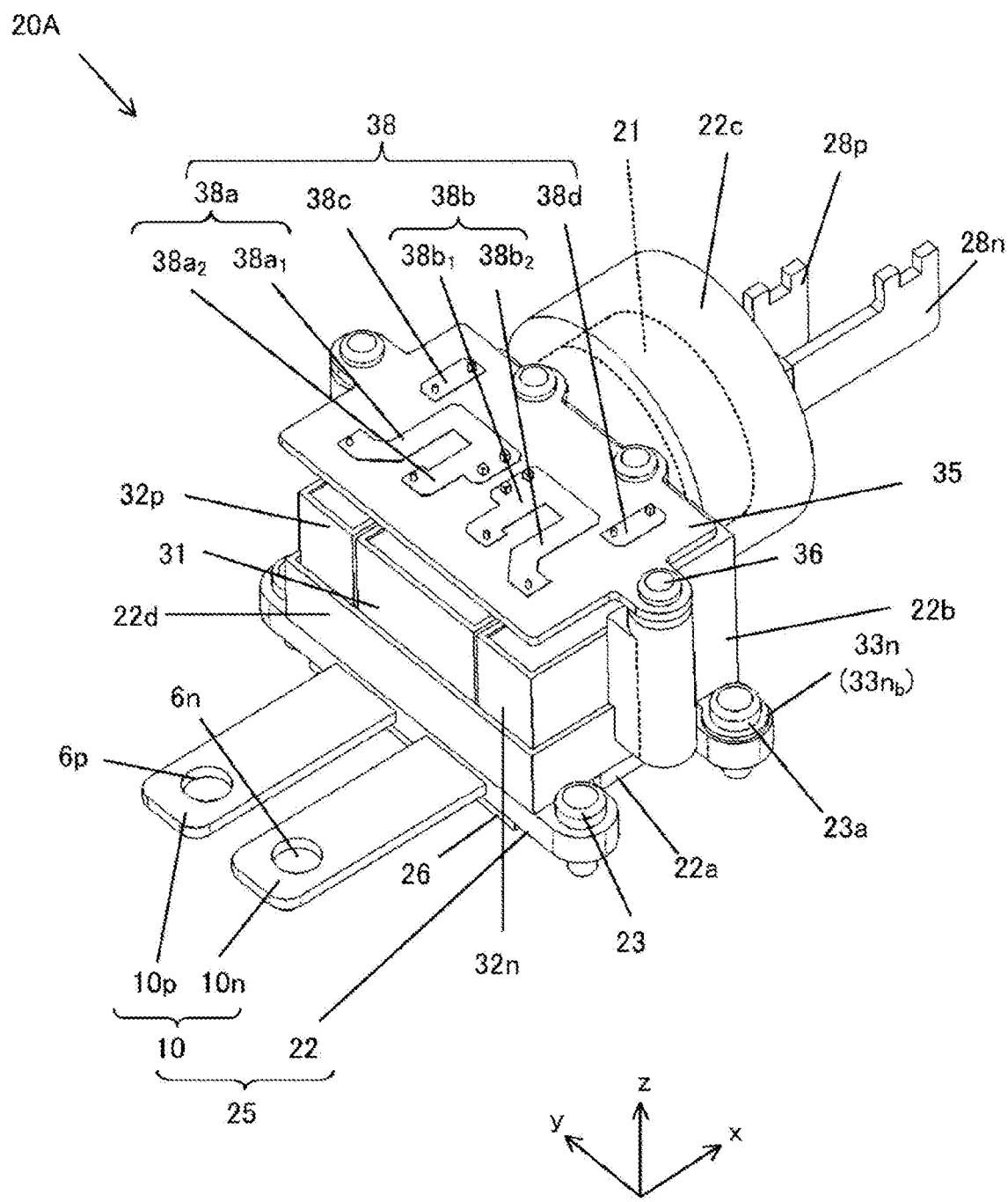
FIG. 4 is an external perspective view of a noise filter assembly illustrated in FIG. 3.
Figure 5:
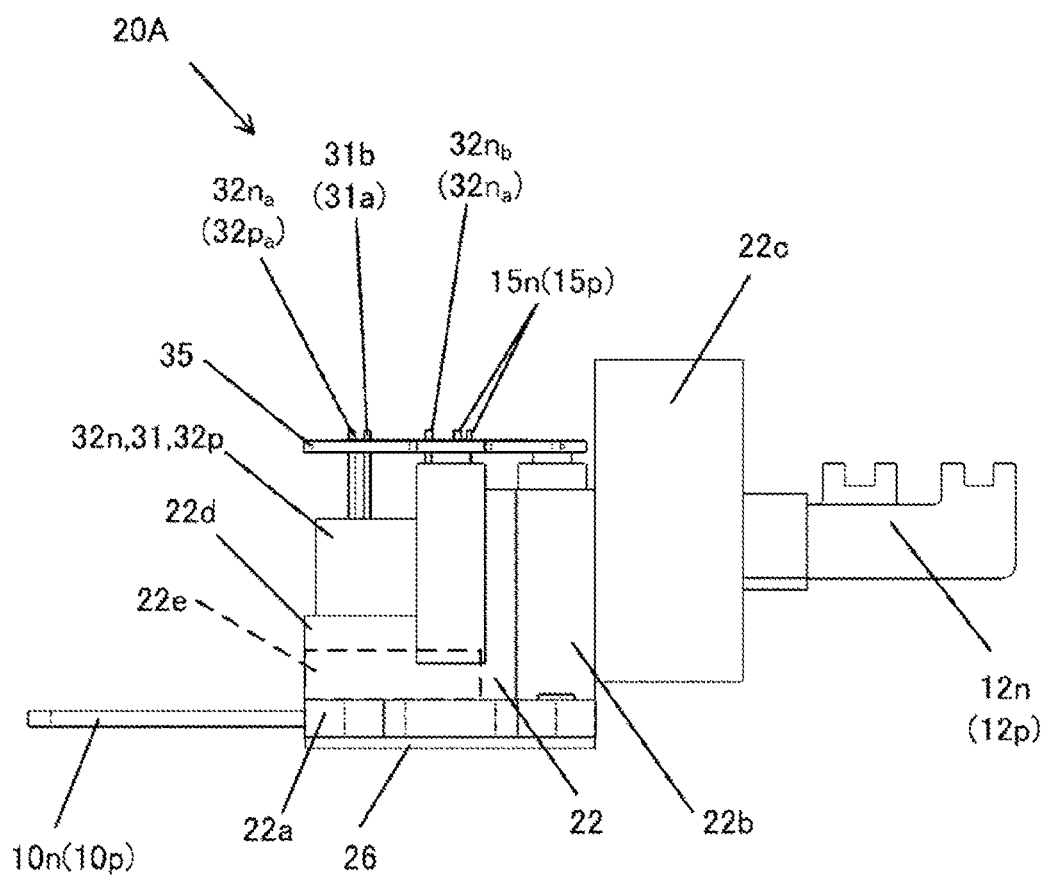
FIG. 5 is a side view of a noise filter assembly illustrated in FIG. 4.
Figure 6:
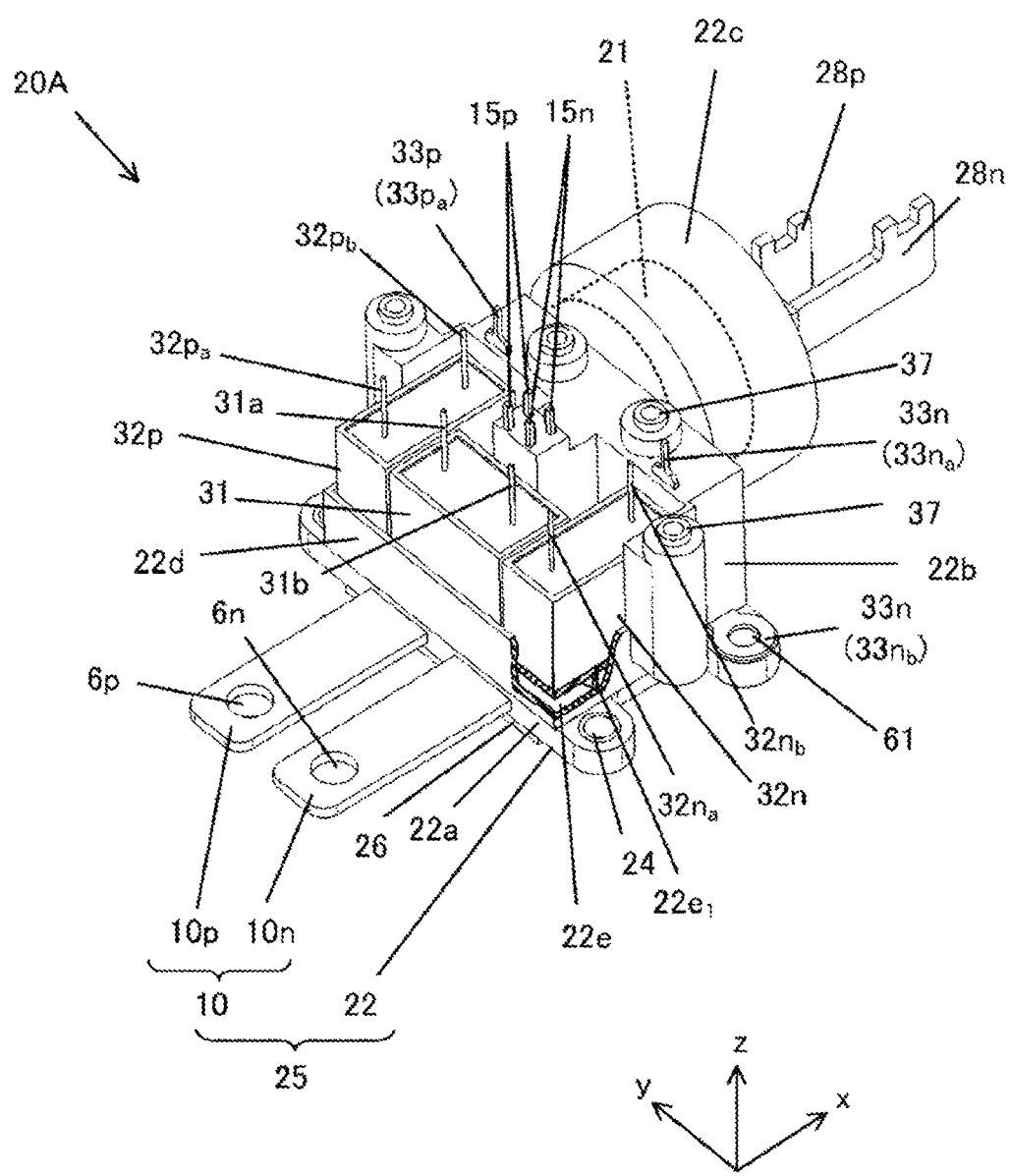
FIG. 6 is a perspective view of the noise filter assembly illustrated in FIG. 4 from which a circuit board removed and illustrates a case where a part of a side portion of a resin member is cut away.
Figure 7:
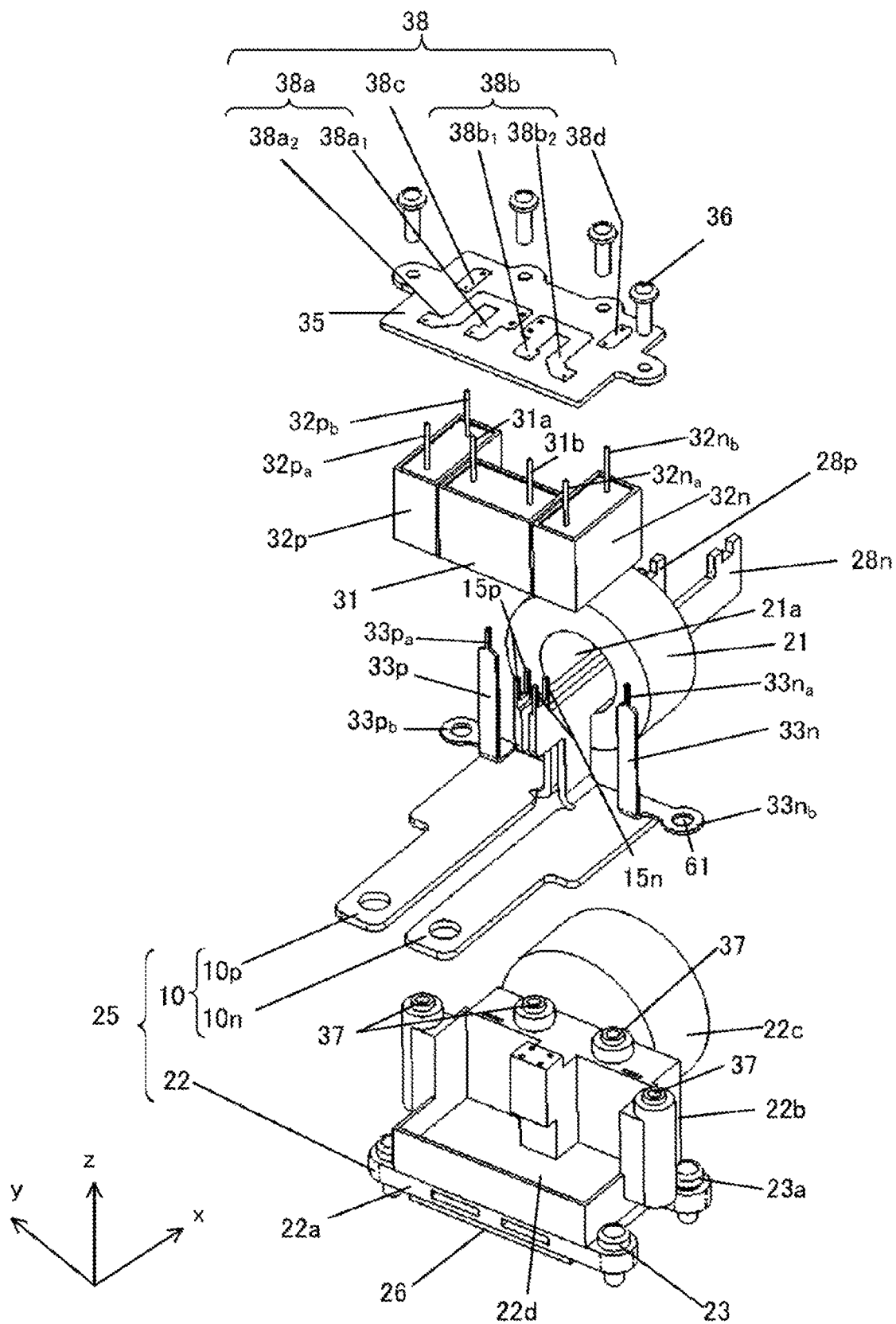
FIG. 7 is an exploded perspective view of the noise filter assembly illustrated in FIG. 4.

FIG. 4 is an external perspective view of the noise filter assembly 20A illustrated in FIG. 3, and FIG. 5 is a side view of FIG. 4. FIG. 6 is a perspective view of the noise filter assembly 20A illustrated in FIG. 4 from which the circuit board is removed and illustrates a case where a part of a side portion of the resin member 22 is cut away. FIG. 7 is an exploded perspective view of the noise filter assembly 20A illustrated in FIG. 4.

The noise filter assembly 20A includes the positive and negative electrode power supply side conductors 10p and 10n, the core member 21, a circuit board 35, the X capacitor 31, the positive and negative electrode side Y capacitors 32p and 32n, and the resin member 22. The positive and negative electrode power supply side conductors 10p and 10n and the resin member 22 are formed as a conductor and resin unit 25 integrated through insert-molding. However, in FIG. 7, the positive and negative electrode power supply side conductors 10p and 10n and the resin member 22 are illustrated separately in order to describe structures and functions of the positive and negative electrode power supply side conductors 10p and 10n.

The core member 21 is indicated by a dotted line in FIGS. 4 and 5. A method of fixing the core member 21 to the resin member 22 will be described below.

The resin member 22 includes a base portion 22a, a conductor fixing portion 22b, a core member attachment portion 22c, and an element housing portion 22d. As illustrated in FIGS. 5 and 6, the resin member 22 has a space portion 22e formed between the base portion 22a and the element housing portion 22d. A rib 22e1 (see FIG. 6) that supports the element housing portion 22d is formed in the space portion 22e. The element housing portion 22d has an outer peripheral sidewall, and the X capacitor 31 and the positive and negative electrode side Y capacitors 32p and 32n are housed in the outer peripheral sidewall of the element housing portion 22d of the resin member 22. The inside of the space portion 22e is an air layer, and thermal resistance between the base portion 22a and the element housing portion 22d is large. Thus, it is possible to protect the X capacitor 31 and the positive and negative electrode side Y capacitors 32p and 32n which are vulnerable to heat housed in the element housing portion 22d.

As described above, the positive and negative electrode power supply side conductors 10p and 10n are formed at the resin member 22 through insert-molding. As illustrated in FIGS. 5 and 6, terminals 15p and 15n are formed at the positive and negative electrode power supply side conductors 10p and 10n, respectively. The terminals 15p and 15n of the positive and negative electrode power supply side conductors 10p and 10n are exposed upward (z direction) from the resin member 22. Two terminal boards 33p and 33n (see FIG. 7) and four collars 37 (see FIG. 7) are formed at the resin member 22 through insert-molding. The collar 37 has a metal ring shape. As illustrated in FIG. 7, the terminal boards 33p and 33n include terminals 33pa and 33na and attachment portions 33pb and 33nb, respectively. The terminals 33pa and 33na and the attachment portions 33pb and 33nb are exposed from the resin member 22 (see FIG. 6). Through holes 61 (see FIG. 6) are formed in the attachment portions 33pb and 33nb of the terminal boards 33p and 33n, and the resin member is fixed to the bottom portion 7a of the case 7 by a screw 23a (see FIG. 4) inserted through the through holes 61 and the through holes 24 formed in the base portion 22a of the resin member 22 (see FIG. 4). Accordingly, the terminal boards 33p and 33n are grounded. In FIG. 7, for the sake of convenience in illustration, the screw 23a is illustrated as being inserted into the through hole 24 of the resin member 22 without being inserted through the through hole 61 of the attachment portion 33nb of the terminal board 33n.

The circuit board 35 is disposed above the X capacitor 31 and the positive and negative electrode side Y capacitors 32p and 32n. The circuit board 35 is fixed to the resin member 22 by inserting a screw 36 through a through hole formed in the circuit board 35 and screwing the screw 36 into the collar 37. A conductor pattern 38 is formed on the circuit board 35. The conductor pattern 38 includes first to fourth conductor pattern portions 38a to 38d. The first conductor pattern portion 38a includes a first branch pattern portion 38a1 and a second branch pattern portion 38a2. The second conductor pattern portion 38b includes a first branch pattern portion 38b1 and a second branch pattern portion 38b2. The first to fourth conductor pattern portions 38a to 38d of the circuit board 35 connect the positive and negative electrode power supply side conductors 10p and 10n, the X capacitor 31, and the positive and negative electrode side Y capacitors 32p and 32n, respectively, as illustrated in FIG. 1. This connection will be described below.

As illustrated in the circuit diagram of FIG. 1, the X capacitor 31 and the Y capacitors 32p and 32n are provided between the positive and negative electrode side power supply conductors 10p and 10n of the present embodiment. Connection portions of the Y capacitors 32p and 32n are grounded. Connection wiring thereof is performed by the conductor pattern 38 formed on the circuit board 35. A total of 12 through holes are formed in the conductor pattern 38. The connection terminals thereof will be described with reference to FIG. 7.

Two terminals 15p are formed at the positive electrode side power supply conductor 10p, and two terminals 15n are formed at the negative electrode side power supply conductor 10n. That is, a total of four terminals are formed on the positive and negative electrode side power supply conductors 10p and 10n.

Two terminals, that is, a positive terminal 31a and a negative terminal 31b are formed at the X capacitor 31. Two terminals, that is, a positive terminal 32pa and a negative terminal 32pb are formed at the Y capacitor 32p, and two terminals, that is, a positive terminal 32na and a negative terminal 32nb are formed at the Y capacitor 32n.

That is, a total of six connection terminals are formed on the X capacitor 31 and the Y capacitors 32p and 32n.

The connection portions of the Y capacitors 32p and 32n are grounded via two terminals, that is, the ground terminal 33pa of the positive electrode side terminal board 33p and the ground terminal 33na of the negative terminal board 33n. That is, the positive and negative electrode side terminal boards 33p and 33n include a total of two terminals.

These twelve connection terminals on the positive and negative electrode sides are inserted into and soldered to 12 through holes of the positive electrode side conductor patterns 38a to 38d formed on the circuit board 35.

The terminal 15p of the positive electrode power supply side conductor 10p is connected to the first conductor pattern portion 38a. One terminal 31a of the X capacitor 31 is connected to the first branch pattern portion 38a1 of the first conductor pattern portion 38a. The terminal 15n of the negative electrode power supply side conductor 10n is connected to the second conductor pattern portion 38b. The other terminal 31b of the X capacitor 31 is connected to the first branch pattern portion 38b1 of the second conductor pattern portion 38b. Thereby, the X capacitor 31 is connected to the positive electrode power supply side conductor 10p and the negative electrode power supply side conductor 10n.

One terminal 32pa of the positive electrode side Y capacitor 32p is connected to the second branch pattern portion 38a2 of the first conductor pattern portion 38a. The other terminal 32pb of the positive electrode side Y capacitor 32p is connected to the third conductor pattern portion 38c. The terminal 33pa of the terminal board 33p is connected to the third conductor pattern portion 38c. As described above, the terminal 15p of the positive electrode power supply side conductor 10p is connected to the first conductor pattern portion 38a. Therefore, the positive electrode power supply side conductor 10p is connected to one terminal 32pa of the positive electrode side Y capacitor 32p, and the other terminal 32pb of the positive electrode side Y capacitor 32p is grounded via the terminal board 33p.

One terminal 32na of the negative electrode side Y capacitor 32n is connected to the second branch pattern portion 38b2 of the second conductor pattern portion 38b.

The other terminal 32nb of the negative electrode side Y capacitor 32n is connected to the fourth conductor pattern portion 38d. The terminal 33na of the terminal board 33n is connected to the fourth conductor pattern portion 38d. As described above, the terminal 15n of the negative electrode power supply side conductor 10n is connected to the second conductor pattern portion 38b. Therefore, the negative electrode power supply side conductor 10n is connected to one terminal 32na of the negative electrode side Y capacitor 32n, and the other terminal 32nb of the negative electrode side Y capacitor 32n is grounded via the terminal board 33n.

The terminals 15p, 15n, 31a, 31b, 32pa, 32pb, 32na, and 32nb are inserted through via holes formed in the circuit board 35, and are connected to the conductor pattern portions.

Figure 8:
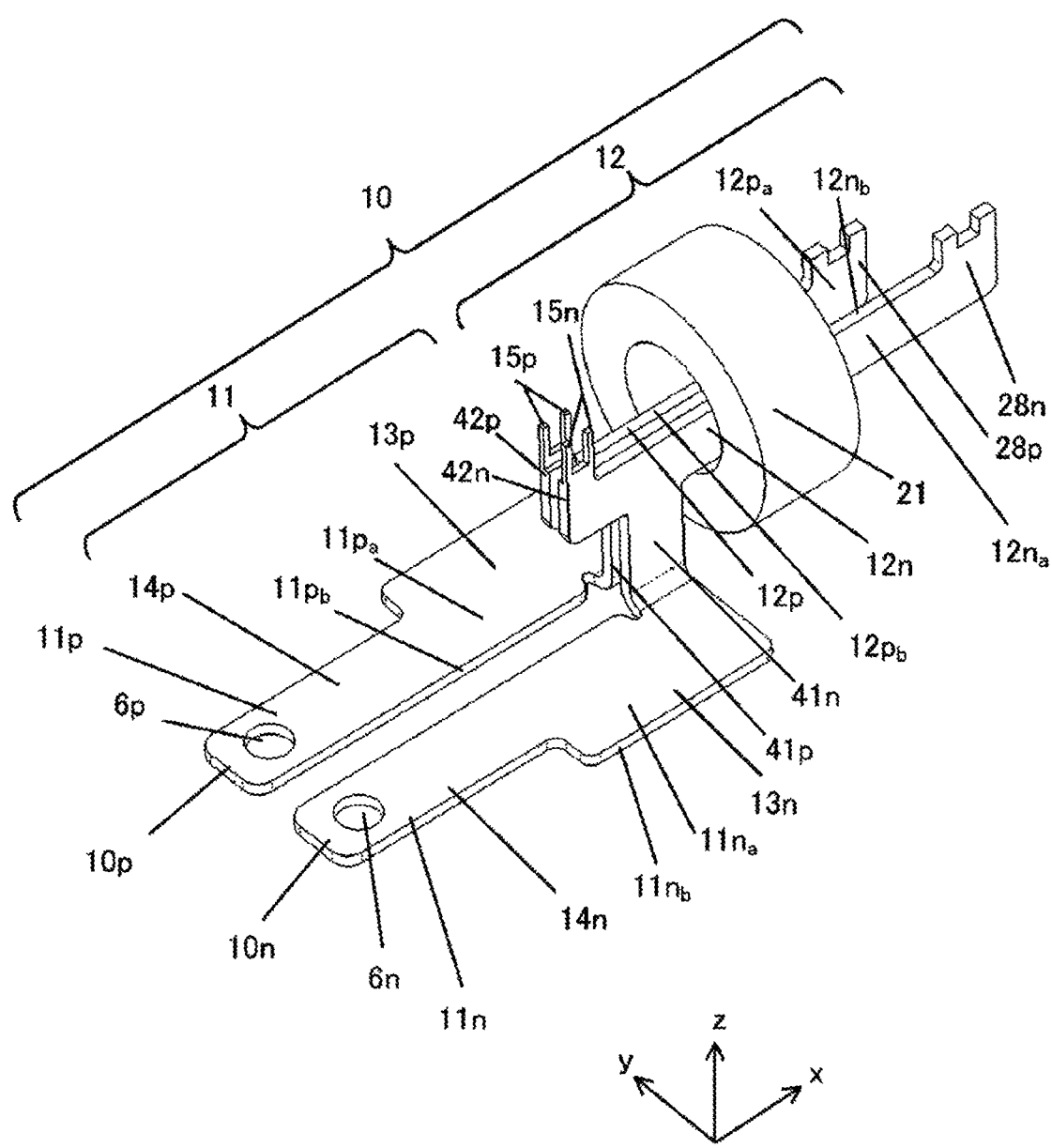
FIG. 8 is an enlarged perspective view of a power supply side conductor and a core member illustrated in FIG. 7.

FIG. 8 is an enlarged perspective view of the power supply side conductor 10 and the core member 21 illustrated in FIG. 7. The power supply side conductor 10 is made of sheet metal, and includes a first conductor portion 11 and a second conductor portion 12. As described above, the power supply side conductor 10 includes the positive electrode power supply side conductor 10p and the negative electrode power supply side conductor 10n. The positive electrode power supply side conductor 10p includes a positive electrode side first conductor portion 11p and a positive electrode side second conductor portion 12p, and the negative electrode power supply side conductor 10n includes a negative electrode side first conductor portion 11n and a negative electrode side second conductor portion 12n. The positive and negative electrode side first conductor portions 11p and 11n and the positive and negative side electrode second conductor portions 12p and 12n are separated from each other by a predetermined distance in the z direction, and all the conductor portions extend in the x direction. The positive and negative electrode side second conductor portions 12p and 12n include intermediate conductor portions 41p and 41n and projecting portions 42p and 42n, respectively. The positive electrode side first conductor portion 11p of the positive electrode power supply side conductor 10p has a main surface 11pa and a side surface 11pb. The side surface 11pb is a side surface in a plate thickness direction, and is disposed in parallel to a direction (z direction) perpendicular to the upper surface 7a1 of the bottom portion 7a of the case 7. The main surface 11pa extends in a direction (xy plane) parallel to the upper surface 7a1 of the bottom portion 7a of the case 7. The main surface 11pa has a larger area than the side surface 11pb. Similarly, the negative electrode side first conductor portion 11n of the negative electrode power supply side conductor 10n has a main surface 11na and a side surface 11nb. The side surface 11nb is a side surface in the plate thickness direction, and is arranged in parallel to a direction (z direction) perpendicular to the upper surface 7a1 of the bottom portion 7a of the case 7. The main surface 11na extends in a direction (xy plane) parallel to the upper surface 7a1 of the bottom portion 7a of the case 7. The main surface 11na has a larger area than the side surface 11nb.

The positive electrode side second conductor portion 12p of the positive electrode power supply side conductor 10p has a main surface 12pa and a side surface 12pb. The side surface 12pb is a side surface in the plate thickness direction, and is disposed in a direction parallel to the upper surface 7a1 of the bottom portion 7a of the case 7. The main surface 12pa extends in a direction (xz surface) perpendicular to the upper surface 7a1 of the bottom portion 7a of the case 7. That is, the main surface 12pa of the positive electrode side second conductor portion 12p of the positive electrode power supply side conductor 10p extends in a direction in which a width which is a length in the z direction is away from the upper surface 7a1 of the bottom portion 7a of the case 7. The main surface 12pa has a larger area than the side surface 12pb.

Similarly, the negative electrode side second conductor portion 12n of the negative electrode power supply side conductor 10n has a main surface 12na and a side surface 12nb. The side surface 12nb is a side surface in the plate thickness direction, and is disposed in a direction parallel to the upper surface 7a1 of the bottom portion 7a of the case 7. The main surface 12na extends in a direction (xz surface) perpendicular to the upper surface 7a1 of the bottom portion 7a of the case 7. That is, the main surface 12na of the negative electrode side second conductor portion 12n of the negative electrode power supply side conductor 10n extends in a direction in which a width which is a length in the z direction is away from the upper surface 7a1 of the bottom portion 7a of the case 7. The main surface 12na has a larger area than the side surface 12nb.

In the positive electrode power supply side conductor 10p, dimensions (hereinafter, also referred to as thicknesses of the side surfaces) of the side surface 11pb of the positive electrode side first conductor portion 11p and the side surface 12pb of the positive electrode side second conductor portion 12p in the z direction can have the same thickness. Similarly, in the negative electrode power supply side conductor 10n, the side surface 11nb of the negative electrode side first conductor portion 11n and the side surface 12nb of the negative electrode side second conductor portion 12n can have the same thickness. The side surface 11pb of the positive electrode side first conductor portion 11p, the side surface 12pb of the positive electrode side second conductor portion 12p, the side surface 11nb of the negative electrode side first conductor portion 11n, and the side surface 12nb of the negative electrode side second conductor portion 12n can have the same thickness. However, the present invention is not limited thereto, and the side surfaces 11pb, 11nb, 12pb, and 12nb may have different thicknesses.

The positive electrode side second conductor portion 12p of the positive electrode power supply side conductor 10p and the negative electrode side second conductor portion 12n of the negative electrode power supply side conductor 10n extend in the x direction which is a longitudinal direction such that the main surface 12pa and the main surface 12na face each other in parallel. The positive electrode side second conductor portion 12p of the positive electrode power supply side conductor 10p and the negative electrode side second conductor portion 12n of the negative electrode power supply side conductor 10n penetrate through the core member 21.

The positive electrode side first conductor portion 11p of the positive electrode power supply side conductor 10p has a first region 13p and a second region 14p having different lengths in the y direction, that is, different widths in a direction perpendicular to a direction in which the current flows. The first region 13p is covered with the resin member 22, and the second region 14p is exposed from the resin member 22. A width of the first region 13p of the positive electrode side first conductor portion 11p of the positive electrode power supply side conductor 10p is larger than a width of the positive electrode side second conductor portion 12p of the positive electrode power supply side conductor 10p. That is, in the positive electrode power supply side conductor 10p, a width of the first region 13p of the positive electrode side first conductor portion 11p in a direction perpendicular to the direction in which the current flows is larger than a width of the positive electrode side second conductor portion 12p in the direction perpendicular to the direction in which the current flows.

Similarly, the negative electrode side first conductor portion 11n of the negative electrode power supply side conductor 10n has a first region 13n and a second region 14n having different lengths in the y direction, that is, different widths in the direction perpendicular to the direction in which the current flows. The first region 13n is covered with the resin member 22, and the second region 14n is exposed from the resin member 22. A width of the first region 13n of the negative electrode side first conductor portion 11n of the negative electrode power supply side conductor 10n is larger than a width of the negative electrode side second conductor portion 12n of the negative electrode power supply side conductor 0n. That is, in the negative electrode power supply side conductor 10n, a width of the first region 13n of the negative electrode side first conductor portion 11n in the direction perpendicular to the direction in which the current flows is larger than a width of the negative electrode side second conductor portion 12n in the direction perpendicular to the direction in which the current flows.

It is preferable that the widths of the first region 13p of the positive electrode side first conductor portion 11p of the positive electrode power supply side conductor 10p and the first region 13n of the negative electrode side first conductor portion 11n of the negative electrode power supply side conductor 10n in the direction perpendicular to the direction in which the current flows are the same. It is preferable that the widths of the positive electrode side second conductor portion 12p of the positive electrode power supply side conductor 10p and the negative electrode side second conductor portion 12n of the negative electrode power supply side conductor 10n in the direction perpendicular to the direction in which the current flow are the same.

Figure 9:
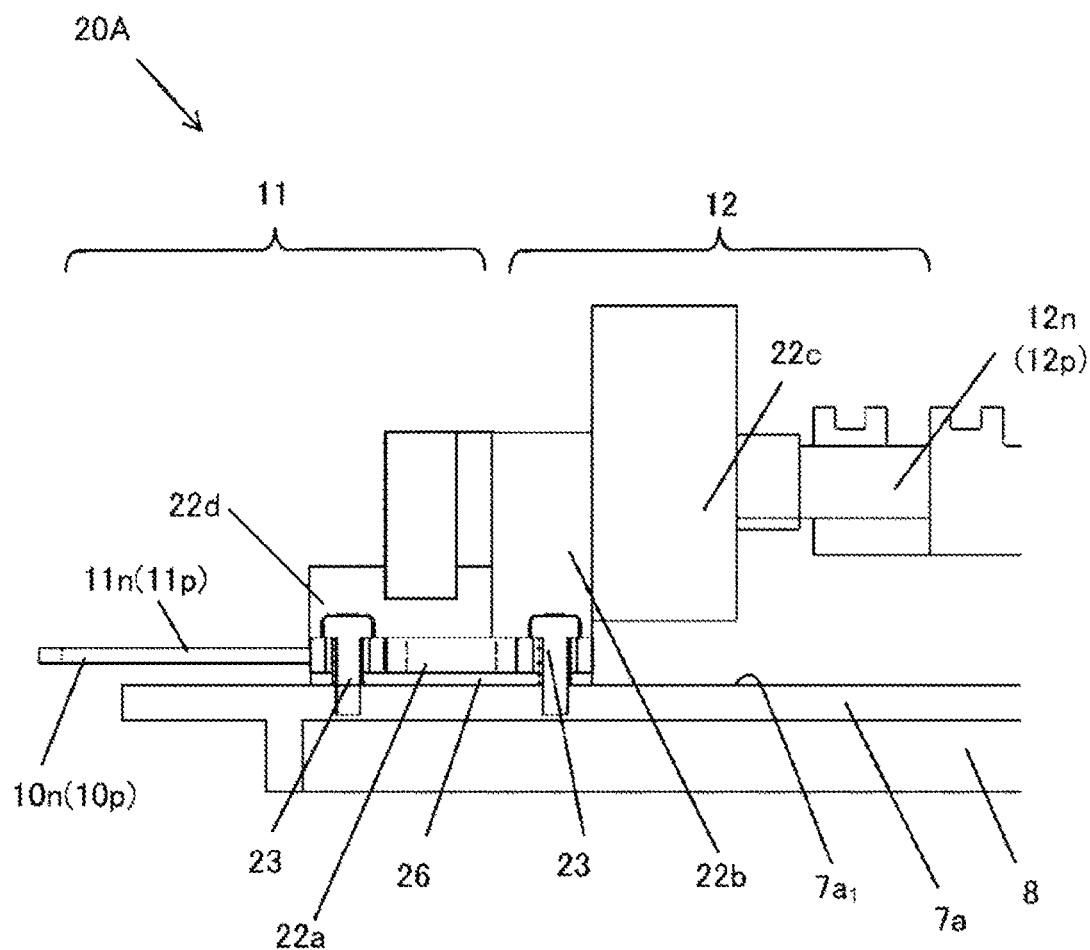
FIG. 9 is a side view of the noise filter assembly attached to a case illustrated in FIG. 2 when viewed in a y direction. Here, a capacitor element and a circuit board are not illustrated.

FIG. 9 is a side view of the noise filter assembly 20A attached to the case illustrated in FIG. 2 when viewed in the y direction. Here, the illustration of the X capacitor 31, the positive and negative electrode side Y capacitors 32p and 32n, and the circuit board 35 is omitted in FIG. 9.

As illustrated in FIG. 5, the insulating sheet 26 having adhesiveness is formed on the lower surface of the base portion 22a of the resin member 22 of the noise filter assembly 20A. The insulating sheet 26 is formed in substantially the same shape and the same area as those of the lower surface of the base portion 22a of the resin member 22. The insulating sheet 26 adhering to the noise filter assembly 20A adheres to the upper surface 7a1 of the bottom portion 7a of the case 7, and the screw 23 is screwed into a screw hole formed in the bottom portion 7a of the case 7 by being inserted into the through hole 24 of the base portion 22a. Accordingly, the noise filter assembly 20A is fixed to the bottom portion 7a of the case 7. The insulating sheet 26 may be interposed between the resin member 22 and the bottom portion 7a of the case 7, and may not have adhesiveness. The insulating sheet 26 has flexibility, and thus, the upper surface 7a1 of the bottom portion 7a of the case 7 and the lower surface of the resin member 22 are brought into close contact with each other.

The base portion 22a of the resin member 22 has a function as a base portion that fixes the positive and negative electrode side first conductor portions 11p and 11n of the positive and negative electrode power supply side conductors 10p and 10n and fixes the resin member 22 to the bottom portion 7a of the case 7. The conductor fixing portion 22b of the resin member 22 is formed so as to cover the positive and negative electrode side intermediate portions 41p and 41n (see FIG. 8) and the positive and negative electrode side projecting portions 42p and 42n (see FIG. 8) to be described below. Here, the terminals 15p and 15n formed on upper portions of the positive and negative electrode side projecting portions 42p and 42n are exposed from the resin member 22. As described above, the positive and negative electrode side intermediate portions 41p and 41n are members that connect the positive and negative electrode side first conductor portions 11p and 11n and the positive and negative electrode side second conductor portions 12p and 12n. The positive electrode side intermediate portion 41p and the positive electrode side projecting portion 42p are integrally formed with the positive electrode side first conductor portion 11pn and the positive electrode side second conductor portion 12p. Similarly, the negative electrode side intermediate portion 41n and the negative electrode side projecting portion 42n are formed integrally with the negative electrode side first conductor portion 11n and the negative electrode side second conductor portion 12n. The positive and negative electrode side intermediate portions 41p and 41n can be defined as connection portions of the first conductor portions 11p and 11n and the second conductor portions 11p and 11n. The positive and negative electrode side projecting portions 42n and 42p can also be defined as connection portions that connect the positive electrode power supply side conductor 10p and the negative electrode power supply side conductor 10n to the noise filter circuit unit 20.

As described above, the conductor fixing portion 22b of the resin member 22 supports the positive and negative electrode side first conductor portions 11p and 11n and the positive and negative electrode side second conductor portions 12p and 12n of the positive and negative electrode power supply side conductors 10p and 10n. The core member attachment portion 22c of the resin member 22 fixes the core member 21.

Referring to FIGS. 6 to 8, the core member 21 is attached to the core member attachment portion 22c of the resin member 22. The core member attachment portion 22c has a cylindrical shape having opened side surfaces in the x direction. The core member 21 is inserted into the core member attachment portion 22c from an opening of the core member attachment portion 22c, and is fixed in the core member attachment portion 22c by using an adhesive. The core member attachment portion 22c is formed integrally with the conductor fixing portion 22b, and has large rigidity. The core member 21 is firmly attached to the core member attachment portion 22c through adhesion. Therefore, a structure for attaching the core member 21 to the resin member 22 is a structure with excellent vibration resistance.

The core member 21 is fixed by forming an engagement piece in the core member attachment portion 22c and inserting the engagement piece into an opening 21a (see FIG. 7) of the core member 21 so as to engage with an end surface of the core member 21 in the x direction.

Figure 10:
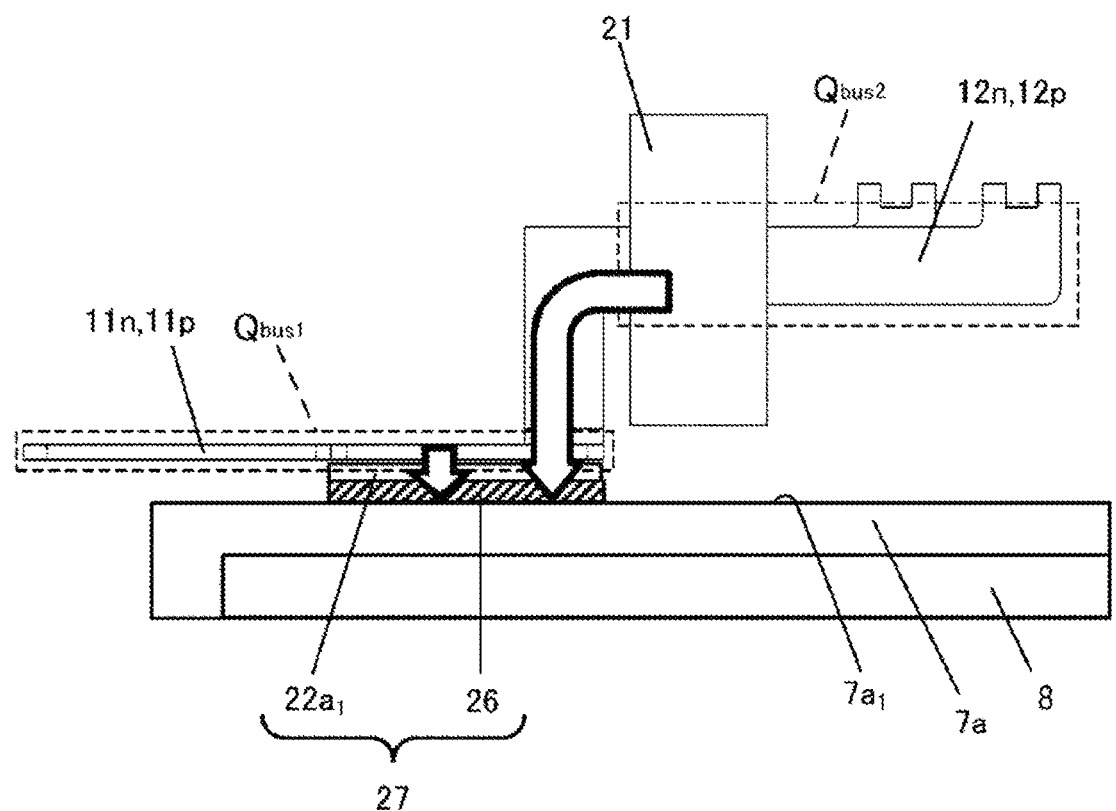
FIG. 10 is a diagram for describing cooling of a noise filter assembly illustrated in FIG. 9.

FIG. 10 is a diagram for describing the cooling of the noise filter assembly 20A illustrated in FIG. 9.

In the following description, the positive and negative electrode power supply side conductors 10p and 10n, the positive and negative electrode side first conductor portions 11p and 11n, the first regions 13p and 13n, and the positive and negative electrode side second conductor portions 12p and 12n may be appropriately referred to as the power supply side conductors 10, the first conductor portions 11, the first regions 13, and the second conductor portions 12, respectively.

The first conductor portion 11 is coupled to the bottom portion 7a of the case 7 so as to be thermally conducted via an insulating member 27 which includes the insulating sheet 26 and an insulating layer 22a1 between the lower surface of the base portion 22a and the lower surface of the first conductor portion 11 at the base portion 22a of the resin member 22. The width of the first region 13 covered with the resin member 22 of the first conductor portion 11 in the direction perpendicular to the direction in which the current flows is larger than the width of the second conductor portion 12 in the direction perpendicular to the direction in which the current flows. That is, a cross-sectional area of the first region 13 of the first conductor portion 11 is larger than a cross-sectional area of the second conductor portion 12. Thus, heat generation Qbus1 of the first conductor portion 11 can be smaller than heat generation Qbus2 of the second conductor portion 12. Accordingly, a power loss of the power supply side conductor 10 can be reduced.

Since the width of the first region 13 of the first conductor portion 11 in the direction perpendicular to the direction in which the current flows is large, a heat radiation area radiated to the case 7 via the insulating member 27 is increased. In the first conductor portion 11, the positive and negative electrode power supply side conductors 10p and 10n are not laminated and coupled to the case 7 so as to be thermally conducted. The positive and negative electrode power supply side conductors 10p and 10n are separately formed, and the positive and negative electrode side first conductor portions 11p and 11n are coupled to the case 7 so as to be thermally conducted. The increase in heat radiation area of the first region 13 can improve heat radiation performance, and can increase an output of the power conversion device 1 such as an inverter.

It is preferable that the power supply side conductor 10 is efficiently cooled by a coolant such as cooling water flowing through the cooling path 8 of the case 7.

Referring back to FIG. 8, the positive and negative electrode power supply side conductors 10p and 10n include, respectively, the positive and negative electrode side intermediate portions 41p and 41n and the positive and negative electrode side projecting portions 42p and 42n which connect the positive and negative electrode side first conductor portions 11p and 11n and the positive and negative electrode side second conductor portions 12p and 12n to each other. The terminals 15p and 15n connected to the conductor pattern 38 of the circuit board 35 are formed at the upper portions (the z direction) of the positive and negative electrode side projecting portions 42p and 42n.

As described above, the positive and negative electrode side second conductor portions 12p and 12n include the intermediate conductor portions 41p and 41n and the projecting portions 42p and 42n, respectively. The positive and negative electrode side intermediate portions 41p and 41n erect, respectively, in the z direction with a predetermined width in the x direction on end portion sides of the positive and negative electrode side first conductor portions 11p and 11n in the x direction and on sides on which the first conductor portions 11p and 11n face each other. The second conductor portions 12p and 12n extend, respectively, in the x direction toward the x direction side on end sides of the erecting intermediate portions 41p and 41n in the z direction. The main surfaces of the intermediate portions 41p and 41n extend on the xz plane. The main surfaces are arranged close to each other, and face each other in parallel. That is, the positive and negative electrode side intermediate portions 41p and 41n extend, respectively, in the z direction which is the direction away from the upper surface 7a1 of the bottom portion 7a of the case 7.

The positive and negative electrode side projecting portions 42p and 42n are, respectively, arranged on sides of the positive and negative electrode side second conductor portions 12p and 12n opposite to the core member 21 in the x direction of the positive and negative electrode side intermediate portions 41p and 41n. That is, the positive and negative electrode side projecting portions 42p and 42n are formed to extend to sides opposite to the core member 21 from the positive and negative electrode side intermediate portions 41p and 41n such that the main surfaces are close to each other and face each other in parallel. The positive and negative electrode side first conductor portions 11p and 11n, the positive and negative electrode side second conductor portions 12p and 12n, the positive and negative electrode side intermediate portions 41p and 41n, the positive and negative electrode side projecting portions 42p and 42n, and the terminals 15p and 15n are integrally molded as the positive and negative electrode power supply side conductors 10p and 10n by using a single plate material.

Figure 11:
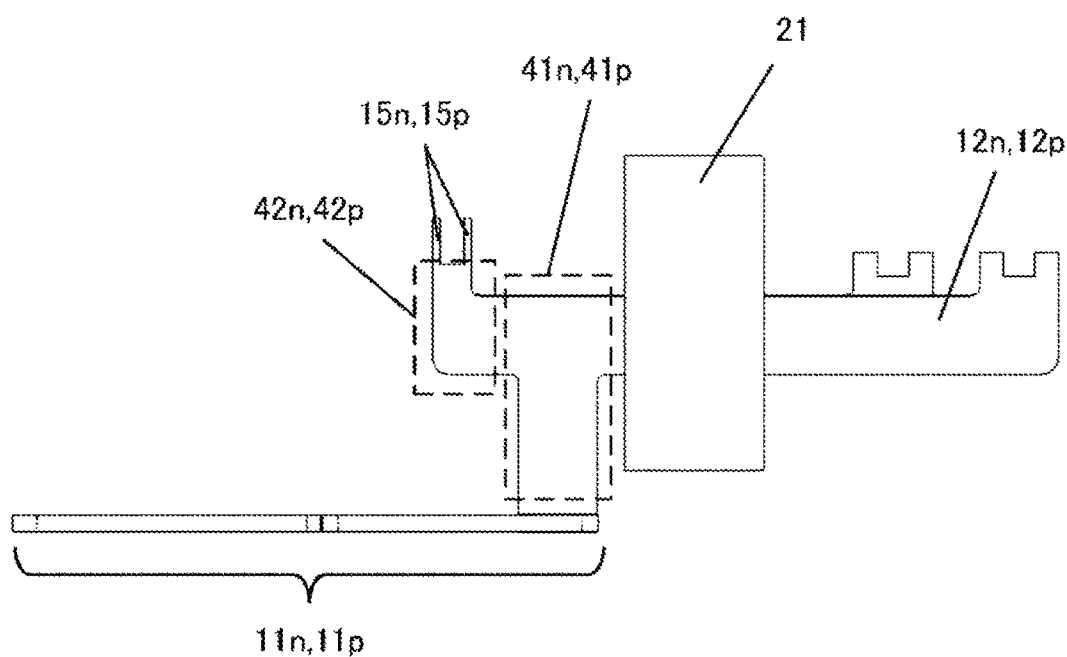
FIGS. 11(a) and 11(b) are diagrams for describing inductance of the power supply side conductor.
Figure 11:
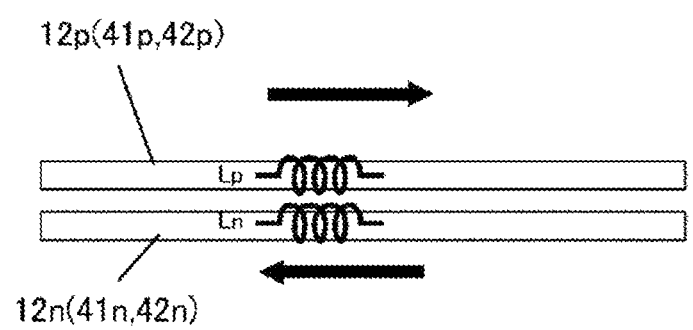

FIGS. 11(a) and 11(b) are diagrams for describing inductance of the power supply side conductor 10.

As illustrated in FIG. 11(a), the positive electrode side second conductor portion 12p and the negative electrode side second conductor portion 12n, the positive electrode side intermediate portion 41p and the negative electrode side intermediate portion 41n, the positive electrode side projecting portion 42p and the negative electrode side projecting portion 42n, and the terminals 15p and the terminals 15n are arranged in a state in which the main surfaces are close to each other and face each other in parallel, that is, are overlapped in a thickness direction of a paper surface.

When the current flows from the high-voltage battery 2 to the inverter main circuit 3 via the positive and negative electrode power supply side conductors 10p and 10n, the currents flows to the noise filter circuit unit 20 provided between the positive and negative electrode power supply side conductors 10p and 10n via the positive electrode side projecting portion 42p and the negative electrode side projecting portion 42n. As illustrated in a principle diagram of FIG. 11(b), the current flows through the positive electrode side second conductor portion 12p including the positive electrode side intermediate portion 41p and the positive electrode side projecting portion 42p, and the negative electrode side second conductor portion 12n including the negative electrode side intermediate portion 41n and the negative electrode side projecting portion 42n in opposite directions. In the present embodiment, the main surfaces of the positive electrode side intermediate portion 41p and the negative electrode side intermediate portion 41n and the main surfaces of the positive electrode side projecting portion 42p and the negative electrode side projecting portion 42n are disposed so as to be close to each other and face in parallel to each other. Thus, the inductance of the power supply side conductor 10 is reduced by canceling magnetic flux due to an in-phase bidirectional current flowing through the positive and negative electrode side intermediate portions 41p and 41n and the positive and negative electrode side projecting portions 42p and 42n. Accordingly, a filter function of the noise filter circuit unit 20 can be improved.

Figure 12:
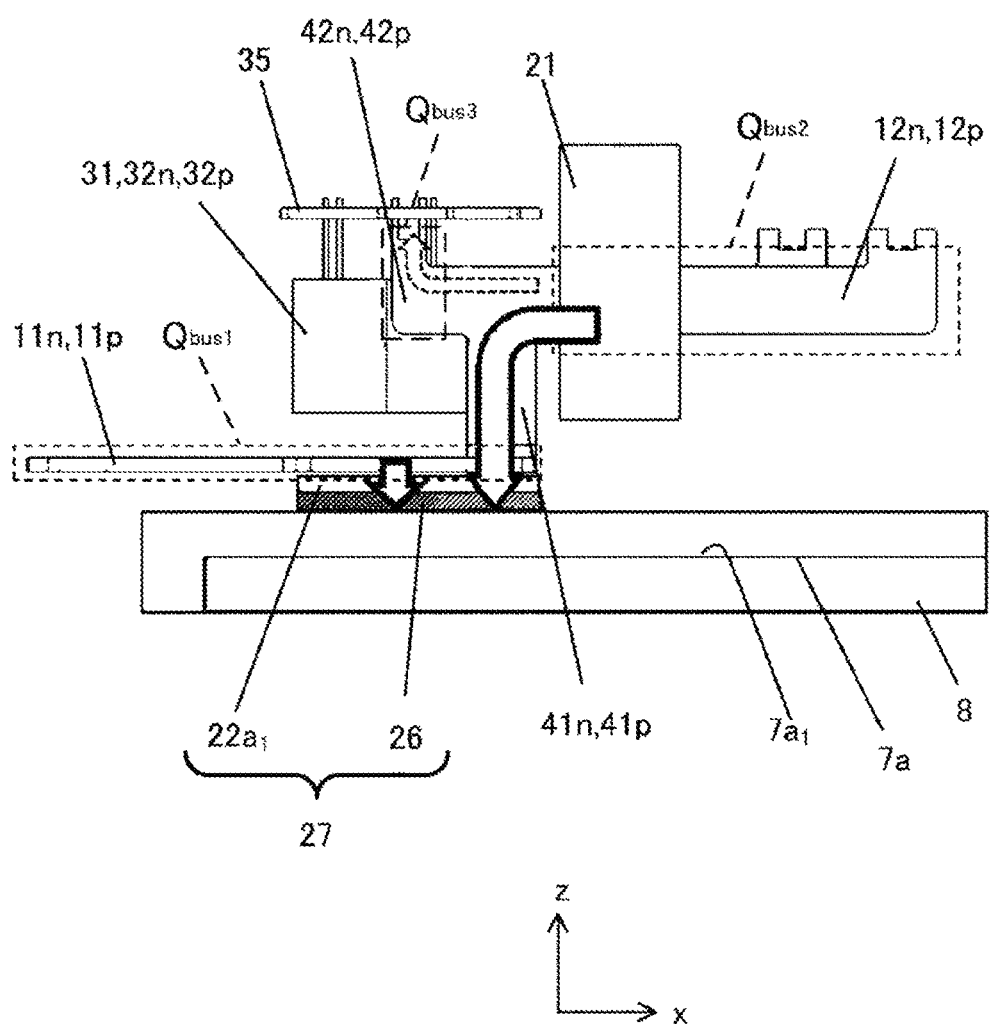
FIG. 12 is a diagram for describing an inflow of heat into an X capacitor and a Y capacitor.

FIG. 12 is a diagram for describing an inflow of heat into the X capacitor 31 and the positive and negative electrode side Y capacitors 32p and 32n.

Since the X capacitor 31 and the positive and negative electrode side Y capacitors 32p and 32n are vulnerable to heat, it is necessary to reduce the inflow of the heat from the positive and negative electrode power supply side conductors 10p and 10n.

In the following description, the positive and negative electrode side intermediate portions 41p and 41n and the positive and negative electrode side projecting portions 42p and 42n may be referred to as the intermediate portions 41 and the projecting portions 42, respectively.

The projecting portions 42 formed at the second conductor portions 12 are connected to the X capacitor 31 and the positive and negative electrode side Y capacitors 32p and 32n via the terminals 15p and 15n. The second conductor portion 12 is formed so as to have a long wiring length and a small cross-sectional area in order to be inserted through the core member 21. Therefore, the heat generation Qbus2 of the second conductor portion 12 is large. However, the intermediate portion 41 serving as a cooling path is formed between the second conductor portion 12 and the first conductor portion 11. The heat generation Qbus2 of the second conductor portion 12 is transferred through the intermediate portion 41 and the insulating member 27, and is cooled by a coolant flowing through the case 7 and the cooling path 8 formed in the case 7. Thus, heat generation Qbus3 transferred to the projecting portion 42 disposed on a side of the intermediate portion 41 of the second conductor portion 12 opposite to the core member 21 is reduced. Therefore, according to the present embodiment, it is possible to reduce the amount of heat flowing from the second conductor portion 12 into the X capacitor 31 and the positive and negative electrode side Y capacitors 32p and 32n which are vulnerable to heat.

Figure 13:
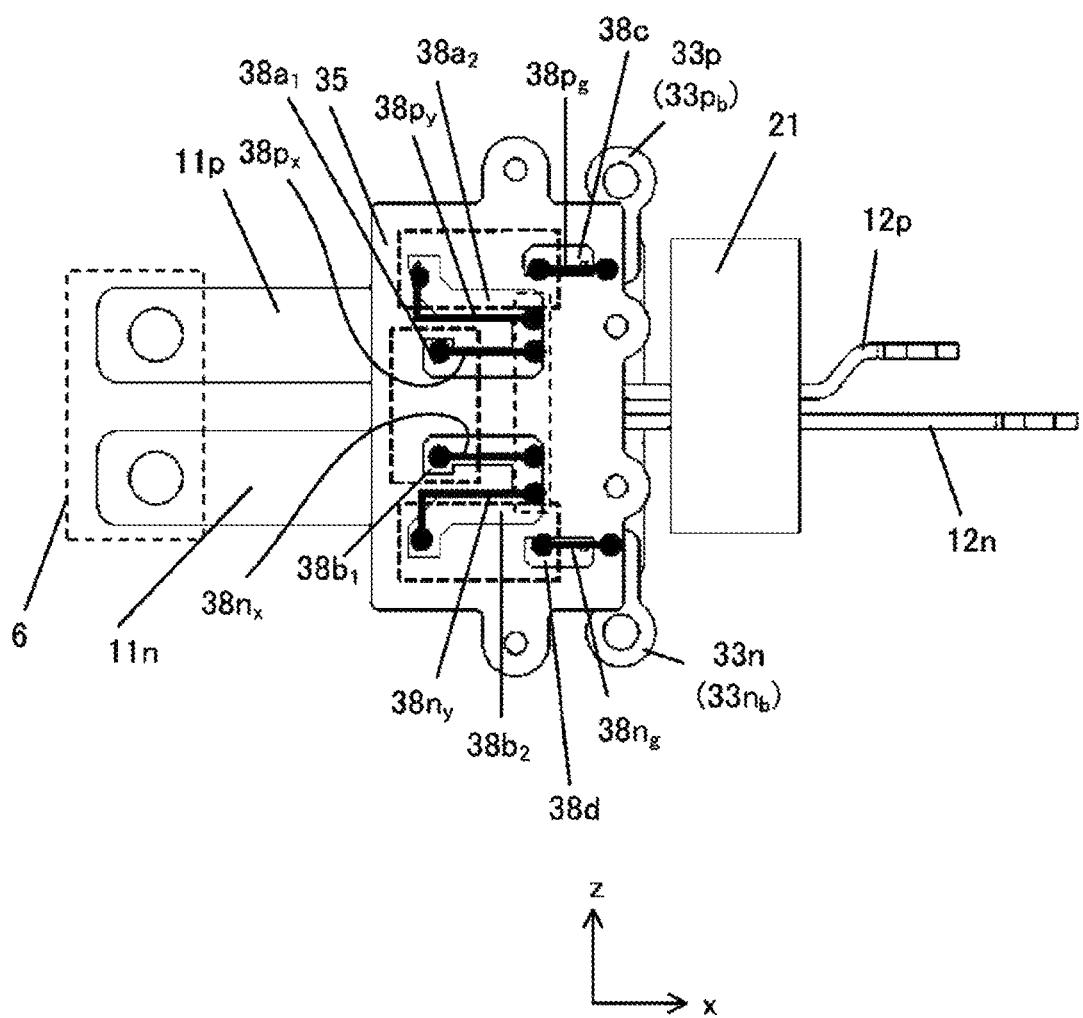
FIG. 13 is a diagram for describing impedance of a noise filter.

FIG. 13 is a diagram for describing impedance of a noise filter. When common mode noises flowing through the positive electrode side Y capacitor 32p and the negative electrode side Y capacitor 32n are unequal, a difference thereof is changed to normal noise.

Thus, it is preferable that wiring impedances 38py and 38pg of the positive electrode side Y capacitor 32p and wiring impedances 38ny and 38ng of the negative electrode side Y capacitor 32n illustrated in FIG. 13 are equal. In the aforementioned description, the reference signs are denoted as follows.

wiring impedance 38py: wiring impedance between terminal 15p and terminal 32pa (see FIG. 7) of positive electrode side Y capacitor 32p wiring impedance 38pg: wiring impedance between terminal 32pb (see FIG. 7) of positive electrode side Y capacitor 32p and attachment portion 33pb (see FIG. 7) of terminal board 33p wiring impedance 38ny: wiring impedance between terminal 15n and terminal 32na (see FIG. 7) of negative electrode side Y capacitor 32n wiring impedance 38ng: wiring impedance between terminal 32nb (see FIG. 7) of negative electrode side Y capacitor 32n and attachment portion 33nb (see FIG. 7) of terminal board 33n It is assumed that a portion at which the second branch pattern portion 38a2 of the first conductor pattern portion 38a is connected to the terminal 15P of the positive electrode side second conductor portion 12p is a positive electrode side connection portion and a portion at which the second branch pattern portion 38a2 is connected to one terminal 32pa of the positive electrode side Y capacitor 32p is a positive electrode side Y capacitor connection portion. It is assumed that a portion at which the second branch pattern portion 38b2 of the second conductor pattern portion 38b is connected to the terminal 15n of the negative electrode side second conductor portion 12n is a negative electrode side connection portion and the second branch pattern portion 38b2 is connected to one terminal 32na of the negative electrode side Y capacitor 32n is a negative electrode side Y capacitor connection portion.

The wiring impedance 38py, that is, a wiring length between the positive electrode side connection portion and the positive electrode side Y capacitor connection portion, and the wiring impedance 38ny, that is, a wiring length between the negative electrode side connection portion and the negative electrode side Y capacitor connection portion are the same. The wiring length from the positive electrode side connection portion to the positive electrode side intermediate portion 41p (see FIG. 8) and the wiring length from the negative electrode side connection portion to the negative electrode side intermediate portion 41n (see FIG. 8) are the same. Therefore, a wiring length from the positive electrode side intermediate portion 41p to the positive electrode side Y capacitor connection portion and a wiring length from the negative electrode side intermediate portion 41n to the negative electrode side Y capacitor connection portion are the same.

In the aforementioned description, the wiring length is used as a term including a length of the wiring of the conductor member (the second conductor portion 12 in this case) in addition to a leading length of the conductor pattern as the circuit wiring.

It is assumed that a portion at which the third conductor pattern portion 38c is connected to the other terminal 32pb of the positive electrode side Y capacitor 32p is a positive electrode side Y capacitor ground side connection portion and a portion at which the third conductor pattern portion 38c is connected to the terminal 33pa of the terminal board 33p is a positive electrode side terminal board connection portion. It is assumed that a portion at which the fourth conductor pattern portion 38d is connected to the other terminal 32nb of the negative electrode side Y capacitor 32n is a negative electrode side Y capacitor ground connection portion and the fourth conductor pattern portion 38d is connected to the terminal 33na of the terminal board 33n is a negative electrode side terminal board connection portion. A wiring length from the positive electrode side Y capacitor ground side connection portion to the positive electrode side terminal board connection portion and a wiring length from the negative electrode side Y capacitor ground side connection portion to the negative electrode side terminal board connection portion are the same.

A wiring length from the terminal 33pa of the terminal board 33p to the attachment portion 33pb and a wiring length from the terminal 33na of the terminal board 33n to the attachment portion 33nb are the same. Therefore, a wiring length from the positive electrode side Y capacitor ground side connection portion to the ground portion and a wiring length from the negative electrode side Y capacitor ground side connection portion to the ground portion are the same.

In FIG. 13, it is preferable that wiring impedance 38px between the terminal 15p and the terminal 31a of the X capacitor 31 and wiring impedance 38nx between the terminal 15n and the terminal 31b of the X capacitor 31 are equal. Thus, in the present embodiment, the wiring lengths of the first branch pattern portion 38a1 of the first conductor pattern portion 38a and the first branch pattern portion 38b1 of the second conductor pattern portion 38b are the same. Therefore, according to this embodiment, the function of the noise filter can be improved.

According to the aforementioned embodiment, the following effects are obtained.

(1) The positive and negative electrode power supply side conductors 10p and 10n includes, respectively, the positive and negative electrode side first conductor portions 11p and 11n and the positive and negative electrode side second conductor portions 12p and 12n which include the side surfaces 11pb, 11nb, 12pb, and 12nb, and the main surfaces 11pa, 11na, 12pa, and 12na of which the areas are larger than those of the side surfaces 11pb, 11nb, 12pb, and 12nb. The positive and negative electrode side first conductor portions 11p and 11n of the positive and negative electrode power supply side conductors 10p and 10n are arranged on the upper surface 7a1 of the base portion 22a of the resin member 22 via the insulating member 27. The positive and negative electrode side second conductor portions 12p and 12n of the positive and negative electrode power supply side conductors 10p and 10n penetrate through the core member 21 in a state in which the main surfaces 12pa and 12na face each other. The widths of the portions of the positive and negative electrode side first conductor portion portions 11p and 11n that are in contact with the insulating member 27 in the direction perpendicular to the direction in which the current flows are larger than the widths of the portions of the positive and negative electrode side second conductor portions 12p and 12n arranged in the core member 21 in the direction perpendicular to the direction in which the current flows. That is, the cross-sectional area of the first region 13 of the first conductor portion 11 is larger than the cross-sectional area of the second conductor portion 12. Thus, the heat generation Qbus1 of the first conductor portion 11 can be smaller than the heat generation Qbus2 of the second conductor portion 12. Accordingly, a power loss of the power supply side conductor 10 can be reduced. Since the heat radiation area of the first conductor portion 11 is large, the heat radiation performance is improved. Therefore, the high output of the power conversion device 1 such as an inverter can be achieved.

(2) The positive electrode power supply side conductor 10p and the negative electrode power supply side conductor 10n include, respectively, the positive electrode side intermediate portion 41p and the negative electrode side intermediate portion 41n which extend in the direction away from one surface of the base portion 22a, and connect the positive and negative electrode side first conductor portions 11p and 11n and the positive and negative electrode side second conductor portions 12p and 12n, and the positive electrode side intermediate portion 41p and the negative electrode side intermediate portion 41n are arranged such that the main surfaces face each other in parallel. Thus, the inductances of the positive electrode power supply side conductors 10p and 10n are reduced by canceling the magnetic flux due to the in-phase bidirectional current flowing through the positive and negative electrode side second conductor portions 12p and 12 and the positive and negative electrode side intermediate portions 41p and 41n. Accordingly, a filter function of the noise filter circuit unit 20 can be improved.

(3) The positive electrode side second conductor portion 12p of the positive electrode power supply side conductor 10p includes the positive electrode side projecting portion 42p connected to the positive electrode side intermediate portion 41p, and the negative electrode side second conductor portion 12n of the negative electrode power supply side conductor 10n includes the negative electrode side projecting portion 42n connected to the negative electrode side intermediate portion 41n. The positive electrode side projecting portion 42p and the negative electrode side projecting portion 42n are disposed such that the main surfaces face each other in parallel, and the positive electrode side projecting portion 42p and the negative electrode side projecting portion 42n are connected to at least one of the X capacitor 31 and the positive and negative electrode side Y capacitors 32p and 32n. Thus, the inductances of the positive and negative electrode power supply side conductors 10p and 10n are reduced by canceling the magnetic flux due to the in-phase bidirectional current.

Accordingly, a filter function of the noise filter circuit unit 20 can be improved. Thus, the inductances of the positive and negative electrode power supply side conductors 10p and 10n are reduced by canceling the magnetic flux due to the in-phase bidirectional current flowing through the positive and negative electrode side second conductor portions 12p and 12 and the positive and negative electrode side projecting portions 42p and 42. Accordingly, a filter function of the noise filter circuit unit 20 can be improved.

(4) The positive electrode side projecting portion 42p is disposed on the opposite side of the core member 21 of the positive electrode side intermediate portion 41p, and the negative electrode side projecting portion 42n is disposed on the side of the negative electrode side intermediate portion 41n opposite to the core member 21. Since the intermediate portion 41 as the cooling path is formed between the second conductor portion 12 and the first conductor portion 11, the heat generated in the second conductor portion 12 is transferred to the intermediate portion 41 and the insulating member 27, and is cooled by the case 7. Thus, the amount of heat transferred to the positive and negative electrode side projecting portions 42p and 42n arranged on the opposite side of the intermediate portion 41 to the core member 21 at the positive and negative electrode side second conductor portions 12p and 12n is reduced. Therefore, according to the present embodiment, it is possible to reduce the amount of heat flowing from the second conductor portion 12 into the X capacitor 31 and the positive and negative electrode side Y capacitors 32p and 32n which are vulnerable to heat via the positive and negative electrode side projecting portions 42p and 42n.

(5) The second branch pattern portion 38a2 of the first conductor pattern portion 38a including the positive electrode side conductor connection portion connected to the positive electrode power supply side conductor 10p and the positive electrode side Y capacitor connection portion connected to the positive electrode side Y capacitor 32p and the second branch pattern portion 38b2 of the second conductor pattern portion 38b including the negative electrode side conductor connection portion connected to the negative electrode power supply side conductor 10n and the negative electrode side Y capacitor connection portion connected to the negative electrode side Y capacitor 32n are provided, and the wiring length from the positive electrode side intermediate portion 41p to the positive electrode side Y capacitor connection portion of the second branch pattern portion 38a2 of the first conductor pattern portion and the wiring length from the negative electrode side intermediate portion 41n to the negative electrode side Y capacitor connection portion of the second branch pattern portion 38b2 of the second conductor pattern portion are the same. Thus, the function of the noise filter can be improved.

(6) The resin member 22 includes the base portion 22a that covers the positive and negative electrode side first conductor portions 11p and 11n of the positive electrode power supply side conductor 10p and the negative electrode power supply side conductor 10n, and the core member attachment portion 22c that covers the core member 21, and the base portion 22a and the core member attachment portion 22c are integrally formed. Thus, the vibration resistance of the core member 21 attached to the resin member 22 is improved.

(7) The resin member 22 further includes the conductor fixing portion 22b that covers the positive electrode side intermediate portion 41p and the negative electrode side intermediate portion 41n, and the base portion 22a, the core member attachment portion 22c, and the conductor fixing portion 22b are integrally formed. Thus, the vibration resistance of the core member 21 attached to the resin member 22 is improved.

(8) The resin member 22 further includes the element housing portion 22d, and the element housing portion 22d is provided on the base portion 22a with the space. Thus, the thermal resistance between the base portion 22a and the element housing portion 22d is increased, and thus, it is possible to protect the X capacitor 31 and positive and negative electrode side Y capacitors 32p and 32n which are vulnerable to heat and are housed in the element housing portion 22d.

MODIFICATION EXAMPLE 1

Figure 14:
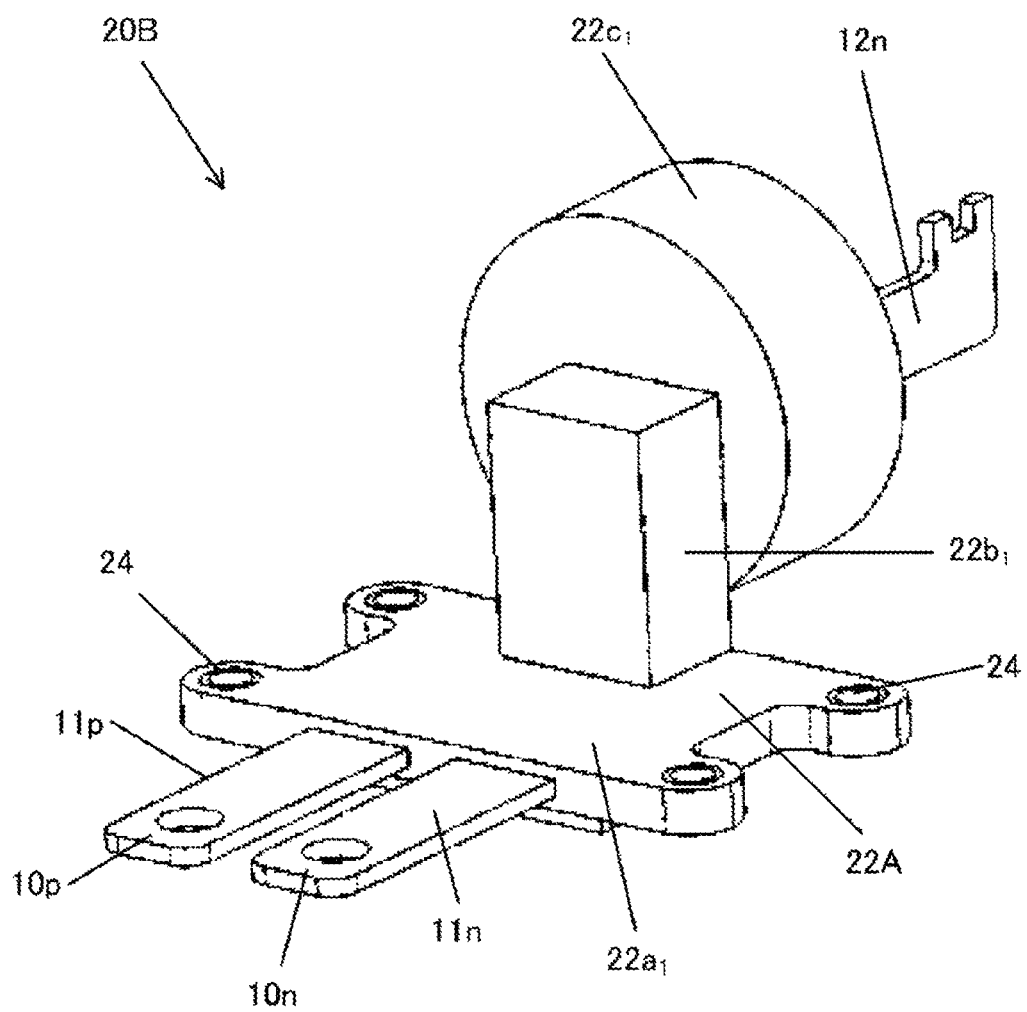
FIG. 14 illustrates Modification Example 1 of the present invention, and is a perspective view illustrating a modification example of the noise filter assembly illustrated in FIG. 4.

FIG. 14 is a perspective view illustrating a modification example of the noise filter assembly 20A illustrated in FIG. 4.

In a noise filter assembly 20B illustrated in FIG. 14, a resin member 22A is different from the resin member 22 illustrated in FIG. 4, and other components are the same.

In the resin member 22A, a base portion 22a1, a conductor fixing portion 22b1, and a core member attachment portion 22c1 are integrally molded. The resin member 22A does not include a portion corresponding to the element housing portion 22d constituting the resin member 22. Attachment portions for attaching the terminal boards 33p and 33n are not formed at the conductor fixing portion 22b1 of the resin member 22A. The resin member 22A is an example of a modification example of the resin member 22 illustrated in FIG. 4, and can be variously modified. It has been described in the aforementioned embodiment that the noise filter assemblies 20A and 20B have the structure in which the positive and negative electrode power supply side conductors 10p and 10n are formed at the resin member 22 through insert-molding.

However, the noise filter assemblies 20A and 20B may have a structure in which the positive and negative electrode power supply side conductors 10p and 10n are attached to the resin member 22 by using a fastening member or an adhesive.

MODIFICATION EXAMPLE 2

Figure 15:
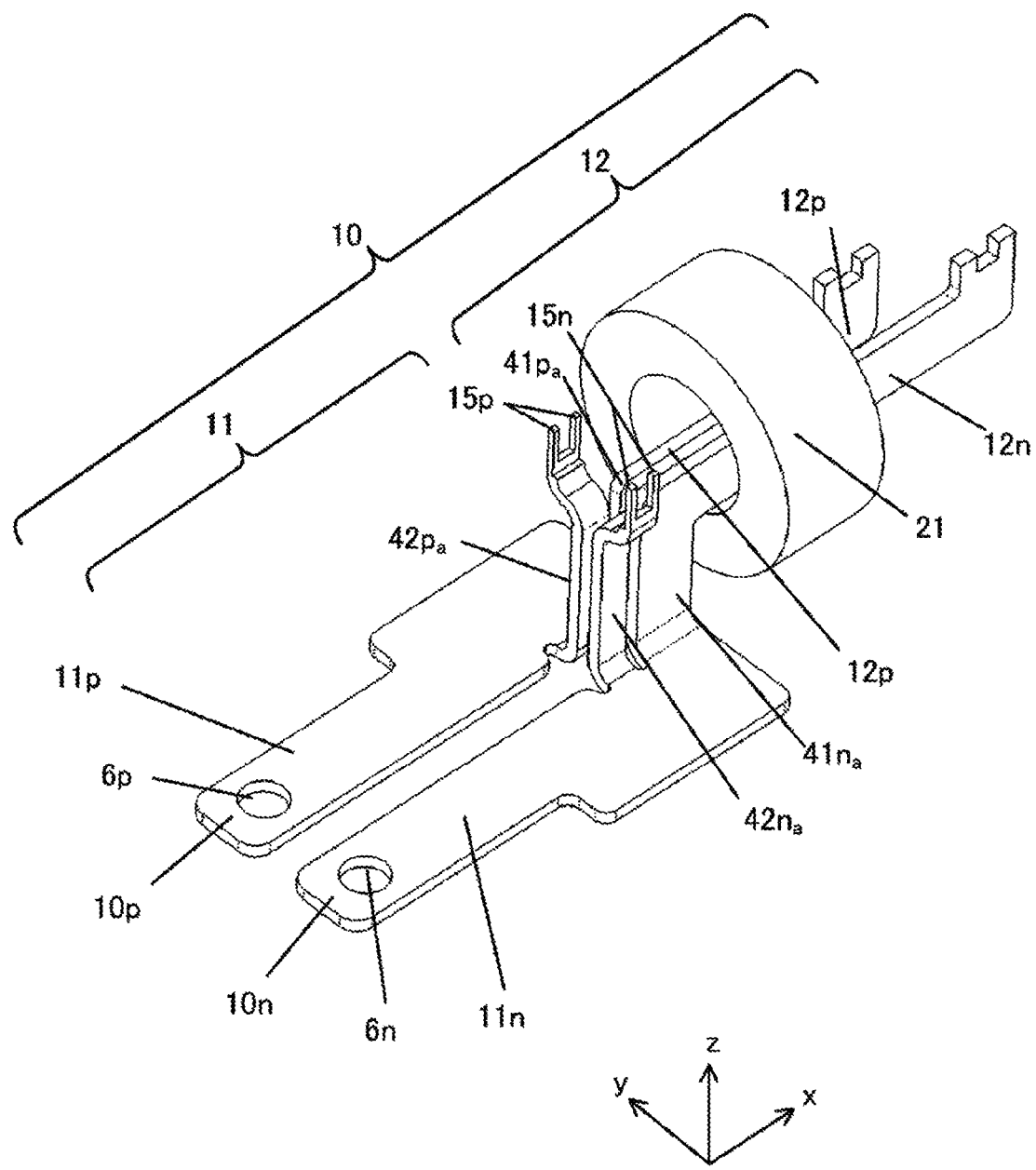
FIG. 15 illustrates Modification Example 2 of the present invention, and is a perspective view illustrating a modification example of the power supply side conductor illustrated in FIG. 8.

FIG. 15 is a perspective view illustrating a modification example of the power supply side conductor 10 illustrated in FIG. 8. The positive and negative electrode power supply side conductors 10p and 10n illustrated as modification examples have a structure in which positive and negative electrode side projecting portions 42pa and 42na are formed separately from the positive and negative electrode side intermediate portions 41pa and 41na. The positive and negative electrode side intermediate portions 41pa and 41na connect the positive and negative electrode side first conductor portions 11p and 11n and the positive and negative electrode side second conductor portions 12p and 12n, respectively. Similarly to the structure illustrated in FIG. 8, the positive and negative electrode side intermediate portions 41pa and 11na extend in the z direction which is the direction away from the upper surface 7a1 of the bottom portion 7a of the case 7. The positive and negative electrode side projecting portions 42pa and 42na are arranged in positions spaced apart from the positive and negative electrode side intermediate portions 41pa and 41na in the x direction such that the main surfaces are close to each other and face each other in parallel.

That is, the positive and negative electrode side projecting portions 42pa and 42na are separated from the positive and negative electrode side intermediate portions 41pa and 41na, respectively, and are thermally insulated. The positive and negative electrode side projecting portions 42pa and 42na are connected to the positive and negative electrode side intermediate portions 41pa and 41na via the positive and negative electrode side first conductor portions 11p and 11n connected to the base sides of the positive and negative electrode side projecting portions 42pa and 42na, respectively. The terminals 15p and 15n connected to the X capacitor 31 and the positive and negative electrode side Y capacitors 32p and 32n are formed at the upper portions of the positive and negative electrode side projecting portions 42pa and 42na in the z direction.

Figure 16:
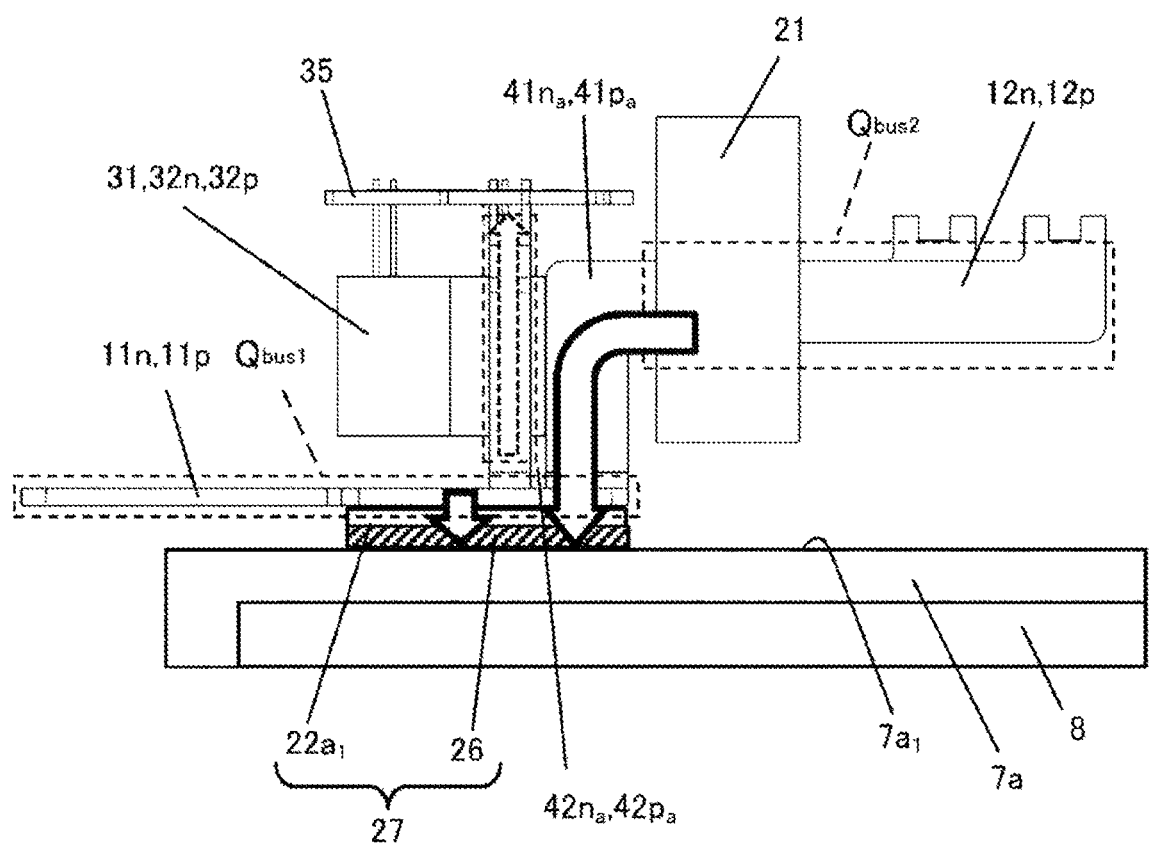
FIG. 16 is a diagram for describing an inflow of heat to the X capacitor and the Y capacitor in the noise filter assembly illustrated in FIG. 15.

FIG. 16 is a diagram for describing an inflow of heat to the X capacitor and the Y capacitor in the noise filter assembly illustrated in FIG. 15. As described above, the positive and negative electrode side projecting portions 42pa and 42na are separated from the positive and negative electrode side intermediate portions 41pa and 41na, and are thermally insulated. Thus, the heat generation Qbus2 in the positive and negative electrode side intermediate portions 41pa and 41na is transferred to the positive and negative electrode side first conductor portions 11p and 11n. That is, the heat generation Qbus2 in the positive and negative electrode side intermediate portions 41pa and 41na is not directly transferred to the positive and negative electrode side projecting portions 42pa and 42na.

The positive and negative electrode side first conductor portions 11p and 11n are in contact with the case 7 via the insulating member 27, and the heat generation Qbus1 in the positive and negative electrode side first conductor portions 11p and 11n and the heat generation Qbus2 in the positive and negative electrode side intermediate portions 41pa and 41na are cooled by the coolant flowing through the case 7 and the cooling path 8 formed in the case 7. Accordingly, the amount of heat transferred to the positive and negative electrode side projecting portions 42pa and 42na via the positive and negative electrode side first conductor portions 11p and 11n is reduced. Thus, it is possible to reduce the inflow of heat to the X capacitor 31 and the positive and negative electrode side Y capacitors 32p and 32n via the terminals 15p and 15n.

The other structure of the power supply side conductor 10 according to Modification Example 2 is the same as that illustrated in FIG. 8. Therefore, in Modification Example 2, it is also possible to improve the filter function and the cooling function. In particular, since heat transfer paths between the positive and negative electrode side projecting portions 42pa and 42na including the terminals 15p and 15n and the positive and negative electrode side intermediate portions 41pa and 41na are large in Modification Example 2, the inflow of heat to the X capacitor 31 and the positive and negative electrode side Y capacitors 32p and 32n can be effectively reduced. As illustrated in FIG. 8, the filter function can be effectively improved in the structure in which the current paths between the positive and negative electrode side intermediate portions 41p and 41n and the positive and negative electrode side intermediate portions 41p and 41n are small. According to the aforementioned embodiment, it is possible to set optimum lengths as the length of the heat transfer path and the length of the current path between the positive and negative electrode side projecting portions 42pa and 42na and the positive and negative electrode side intermediate portions 41pa and 41na in terms of protection of the capacitor elements from heat and improvement of the filter function.

It has been described in the aforementioned embodiment that the noise filter assemblies 20A and 20B are attached to the bottom portion 7a of the case 7. However, the noise filter assemblies 20A and 20B may be attached to a peripheral side surface of the case 7 or a flange formed at the case 7. Moreover, the noise filter assemblies may be attached to a plate-shaped base member instead of being housed within the case. Although it has been described that the cooling path 8 through which the coolant such as cooling water flows is formed as the cooling structure for cooling the noise fill assemblies 20A and 20B, the cooling path 8 may not be formed, and a heat radiation unit such as a heat radiating fin may be provided on an outer surface of the case or the base member.

It has been described in the aforementioned embodiment that the X capacitor 31 and the positive and negative electrode side Y capacitors 32p and 32n are housed within the element housing portion 22d having the outer peripheral sidewall. However, the element housing portion 22d provided at the resin member 22 may be a flat plate-shaped support portion that does not have the outer peripheral sidewall.

Although various embodiments and modification examples have been described above, the present invention is not limited to these contents. Other aspects considered within the scope of the technical idea of the present invention are also included within the scope of the present invention.

REFERENCE SIGNS LIST 1 power conversion device
5 capacitor circuit unit
5A capacitor module
6 DC power supply terminal
7 case
7a bottom portion (base)
7a1 upper surface (one surface)
10 power supply side conductor
10p positive electrode power supply side conductor (positive electrode side conductor)
10n negative electrode power supply side conductor (negative electrode side conductor)
11 first conductor portion
11p positive electrode side first conductor portion
11pa main surface
11pb side surface
11n negative electrode side first conductor portion
11na main surface
11nb side surface
12 second conductor portion
12p positive electrode side second conductor portion
12pa main surface
12pb side surface
12n negative electrode side second conductor portion
12na main surface
12nb side surface
15p, 15n terminal
20 noise filter circuit unit 20A, 20B noise filter assembly
21 core member
22, 22A resin member
22a base portion
22a1 part of base portion (part of insulating member)
22b, 22b1 conductor fixing portion
22c, 22c1 core member attachment portion
22d element housing portion
22e space portion (space)
25 conductor and resin unit
26 insulating sheet (part of insulating member)
27 insulating member
31 X capacitor
32p positive electrode side Y capacitor
32n negative electrode side Y capacitor
34 ground terminal
35 circuit board
38 conductor pattern
38a first conductor pattern portion
38a1 first branch pattern portion
38a2 second branch pattern portion (first conductor pattern)
38b second conductor pattern portion
38b1 first branch pattern portion
38b2 second branch pattern portion (second conductor pattern)
41 intermediate portion
41p, 41pa positive electrode side intermediate portion
41n, 41na negative electrode side intermediate portion
42 projecting portion
42p, 42pa positive electrode side projecting portion
42n, 42pa negative electrode side projecting portion

The invention claimed is:

1. A power conversion device comprising:
a DC power supply terminal to which a DC power is supplied;
a capacitor circuit unit that smooths the DC power, and supplies the smoothed DC power to a power conversion circuit unit;
a power supply side conductor that connects the DC power supply terminal and the capacitor circuit unit to each other;
a core member that surrounds a part of the power supply side conductor; and
a base that houses the power supply side conductor and the core member,
wherein the power supply side conductor includes a positive electrode side conductor and a negative electrode side conductor,
each of the positive electrode side conductor and the negative electrode side conductor includes a first conductor portion and a second conductor portion which each have a side surface and a main surface having an area larger than an area of the side surface,
the first conductor portions of the positive electrode side conductor and the negative electrode side conductor are arranged on one surface of the base with an insulating member interposed therebetween,
the second conductor portions of the positive electrode side conductor and the negative electrode side conductor penetrate the core member in a state in which the main surfaces face each other, and
widths of portions of the first conductor portions of the positive electrode side conductor and the negative electrode side conductor which are in contact with the insulating member in a direction perpendicular to a direction in which a current flows are larger than widths of portions of the second conductor portions of the positive electrode side conductor and the negative electrode side conductor which are arranged within the core member in the direction perpendicular to the direction in which the current flows.

2. The power conversion device according to claim 1, wherein the main surfaces of the second conductor portions extend in a direction away from the one surface of the base.

3. The power conversion device according to claim 1, wherein
the positive electrode side conductor and the negative electrode side conductor include a positive electrode side intermediate portion and a negative electrode side intermediate portion which extend in a direction away from the one surface of the base to connect the first conductor portion and the second conductor portion, respectively, and
the positive electrode side intermediate portion and the negative electrode side intermediate portion are arranged such that main surfaces face each other in parallel.

4. The power conversion device according to claim 3, further comprising:
at least one of an X capacitor connected to the positive electrode side conductor and the negative electrode side conductor and a Y capacitor connected to the positive electrode side conductor or the negative electrode side conductor and a ground,
wherein the second conductor portion of the positive electrode side conductor includes a positive electrode side projecting portion connected to the positive electrode side intermediate portion,
the second conductor portion of the negative electrode side conductor includes a negative electrode side projecting portion connected to the negative electrode side intermediate portion,
the positive electrode side projecting portion and the negative electrode side projecting portion are arranged such that main surfaces face each other in parallel, and
the positive electrode side projecting portion and the negative electrode side projecting portion are connected to at least one of the X capacitor and the Y capacitor.

5. The power conversion device according to claim 4, wherein
the positive electrode side projecting portion is disposed on a side of the positive electrode side intermediate portion opposite to the core member, and
the negative electrode side projecting portion is disposed on a side of the negative electrode side intermediate portion opposite to the core member.

6. The power conversion device according to claim 3, further comprising:
at least one of an X capacitor connected to the positive electrode side conductor and the negative electrode side conductor and a Y capacitor connected to the positive electrode side conductor or the negative electrode side conductor and a ground,
wherein the positive electrode side conductor and the negative electrode side conductor include a positive electrode side projecting portion and a negative electrode side projecting portion connected to the first conductor portions, respectively, and
the positive electrode side projecting portion and the negative electrode side projecting portion are arranged such that main surfaces face each other in parallel, and are connected to at least one of the X capacitor and the Y capacitor.

7. The power conversion device according to claim 3, further comprising:
a positive electrode side Y capacitor connected to the positive electrode side conductor and a ground, and a negative electrode side Y capacitor connected to the negative electrode side conductor and the ground;
a first conductor pattern that includes a positive electrode side conductor connection portion connected to the positive electrode side conductor and a positive electrode side Y capacitor connection portion connected to the positive electrode side Y capacitor; and
a second conductor pattern that includes a negative electrode side conductor connection portion connected to the negative electrode side conductor and a negative electrode side Y capacitor connection portion connected to the negative electrode side Y capacitor,
wherein a wiring length from the positive electrode side intermediate portion to the positive electrode side Y capacitor connection portion of the first conductor pattern and a wiring length from the negative electrode side intermediate portion to the negative electrode side Y capacitor connection portion of the second conductor pattern are the same.

8. The power conversion device according to claim 3, further comprising:
a resin member that holds the positive electrode side conductor and the negative electrode side conductor,
wherein the resin member includes a first resin portion that covers the first conductor portions of the positive electrode side conductor and the negative electrode side conductor, a second resin portion that covers the core member, and a third resin portion that covers the positive electrode side intermediate portion and the negative electrode side intermediate portion, and
the first resin portion, the second resin portion, and the third resin portion are integrally formed.

9. The power conversion device according to claim 1, further comprising:
a resin member that holds the positive electrode side conductor and the negative electrode side conductor,
wherein the resin member includes a first resin portion that covers the first conductor portions of the positive electrode side conductor and the negative electrode side conductor, and
a second resin portion that covers the core member, and
the first resin portion and the second resin portion are integrally formed.

10. The power conversion device according to claim 9, wherein
the resin member includes a capacitor element support portion, and
the capacitor element support portion is formed on the first resin portion with a space.

* * * * *